US011510341B2

(12) United States Patent
Mukundan et al.

(10) Patent No.: US 11,510,341 B2
(45) Date of Patent: Nov. 22, 2022

(54) ENGINEERED ACTUATORS USABLE IN MEMS ACTIVE COOLING DEVICES

(71) Applicant: Frore Systems Inc., San Jose, CA (US)

(72) Inventors: Vikram Mukundan, San Ramon, CA (US); Suryaprakash Ganti, Los Altos, CA (US); Ananth Saran Yalamarthy, Stanford, CA (US); Seshagiri Rao Madhavapeddy, La Jolla, CA (US); Prabhu Sathyamurthy, San Jose, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

(21) Appl. No.: 17/023,215

(22) Filed: Sep. 16, 2020

(65) Prior Publication Data

US 2021/0176895 A1    Jun. 10, 2021

Related U.S. Application Data

(63) Continuation-in-part of application No. 16/915,912, filed on Jun. 29, 2020.

(60) Provisional application No. 62/945,001, filed on Dec. 6, 2019.

(51) Int. Cl.
*H05K 7/20* (2006.01)

(52) U.S. Cl.
CPC ..... *H05K 7/20509* (2013.01); *H05K 7/20254* (2013.01); *H05K 7/20418* (2013.01)

(58) Field of Classification Search
CPC ........... H05K 7/20509; H05K 7/20281; H05K 7/20254; H05K 7/20418; B81B 7/0093; H01L 41/042; H01L 41/047

USPC .......................................................... 361/704
See application file for complete search history.

(56) References Cited

U.S. PATENT DOCUMENTS

| | | |
|---|---|---|
| 4,251,031 A | 2/1981 | Martin |
| 4,450,505 A | 5/1984 | Mittal |
| 4,595,338 A | 6/1986 | Kolm |
| 4,667,877 A | 5/1987 | Yao |

(Continued)

FOREIGN PATENT DOCUMENTS

| | | |
|---|---|---|
| CN | 101032718 | 9/2007 |
| CN | 101718235 | 6/2010 |

(Continued)

OTHER PUBLICATIONS

Murata Manufacturing Co., Ltd., Microblower MZB1001T02, Microblower (Air Pump), Micro Mechatronics, Apr. 2014, downloaded from https://www.murata.com/en-us/products/mechatronics/fluid/microblower_mzb1001t02.

(Continued)

*Primary Examiner* — Anatoly Vortman
(74) *Attorney, Agent, or Firm* — Van Pelt, Yi & James LLP

(57) ABSTRACT

An actuator usable in a cooling system is described. The actuator includes an anchored region and a cantilevered arm. The cantilevered arm extends outward from the anchored region. The cantilevered arm includes a step region, an extension region and an outer region. The step region extends outward from the anchored region and has a step thickness. The extension region extends outward from the step region and has an extension thickness less than the step thickness. The outer region extends outward from the extension region and has an outer thickness greater than the extension thickness.

23 Claims, 10 Drawing Sheets

(56) References Cited

U.S. PATENT DOCUMENTS

| | | | |
|---|---|---|---|
| 4,751,713 A | 6/1988 | Affleck | |
| 4,780,062 A | 10/1988 | Yamada | |
| 4,834,619 A | 5/1989 | Walton | |
| 4,923,000 A | 5/1990 | Nelson | |
| 5,008,582 A | 4/1991 | Tanuma | |
| 5,673,171 A | 9/1997 | Varghese | |
| 5,758,823 A | 6/1998 | Glezer | |
| 5,796,152 A * | 8/1998 | Carr | H01H 1/0036 73/504.15 |
| 5,821,962 A | 10/1998 | Kudo | |
| 5,861,703 A | 1/1999 | Losinski | |
| 6,211,598 B1 * | 4/2001 | Dhuler | F16K 99/0042 310/40 MM |
| 6,232,680 B1 | 5/2001 | Bae | |
| 6,450,773 B1 | 9/2002 | Upton | |
| 6,483,419 B1 * | 11/2002 | Weaver | B81B 3/0024 337/16 |
| 6,498,725 B2 | 12/2002 | Cole | |
| 6,531,947 B1 * | 3/2003 | Weaver | B82Y 15/00 337/123 |
| 6,570,750 B1 * | 5/2003 | Calcatera | H01P 1/127 361/115 |
| 6,588,497 B1 | 7/2003 | Glezer | |
| 6,598,960 B1 * | 7/2003 | Cabal | B41J 2/1639 347/56 |
| 6,612,816 B1 | 9/2003 | Vanden Brande | |
| 6,650,542 B1 | 11/2003 | Chrysler | |
| 6,713,942 B2 | 3/2004 | Raman | |
| 6,771,158 B2 | 8/2004 | Lee | |
| 6,853,068 B1 | 2/2005 | Djekic | |
| 6,876,047 B2 * | 4/2005 | Cunningham | B81B 3/0024 200/512 |
| 6,996,441 B1 | 2/2006 | Tobias | |
| 7,023,697 B2 | 4/2006 | Pokharna | |
| 7,031,155 B2 * | 4/2006 | Sauciuc | H01L 23/467 257/722 |
| 7,081,699 B2 | 7/2006 | Keolian | |
| 7,258,464 B2 | 8/2007 | Morris | |
| 7,282,837 B2 | 10/2007 | Scher | |
| 7,321,184 B2 | 1/2008 | Lee | |
| 7,324,323 B2 * | 1/2008 | Aksyuk | G01J 5/40 361/290 |
| 7,420,807 B2 | 9/2008 | Mikubo | |
| 7,492,076 B2 | 2/2009 | Heim | |
| 7,516,776 B2 | 4/2009 | Bezama | |
| 7,553,135 B2 | 6/2009 | Cho | |
| 7,714,433 B2 | 5/2010 | Campini | |
| 7,742,299 B2 | 6/2010 | Sauciuc | |
| 7,972,124 B2 | 7/2011 | Hirata | |
| 8,051,905 B2 | 11/2011 | Arik | |
| 8,289,701 B2 | 10/2012 | Suzuki | |
| 8,297,947 B2 | 10/2012 | Van Rensburg | |
| 8,308,453 B2 | 11/2012 | Yamamoto | |
| 8,308,454 B2 | 11/2012 | Kamitani | |
| 8,520,383 B2 | 8/2013 | Park | |
| 8,520,384 B2 * | 8/2013 | Park | H01L 23/467 361/679.48 |
| 8,659,896 B2 | 2/2014 | Dede | |
| 8,678,787 B2 | 3/2014 | Hirata | |
| 8,684,707 B2 | 4/2014 | Kanai | |
| 8,736,139 B2 * | 5/2014 | Lee | H01L 27/1469 216/13 |
| 8,899,944 B2 | 12/2014 | Kanai | |
| 8,934,240 B2 | 1/2015 | Yu | |
| 9,179,575 B1 | 11/2015 | Yao | |
| 9,215,520 B2 | 12/2015 | De Bock | |
| 9,252,069 B2 | 2/2016 | Bhunia | |
| 9,466,452 B1 * | 10/2016 | Liu | H01L 21/02532 |
| 9,523,367 B2 | 12/2016 | Lucas | |
| 9,846,461 B2 | 12/2017 | Tang | |
| 9,976,547 B2 | 5/2018 | Tanaka | |
| 10,480,502 B2 | 11/2019 | Hirata | |
| 10,788,034 B2 * | 9/2020 | Ganti | F04B 53/10 |
| 10,943,850 B2 * | 3/2021 | Ganti | H04M 1/0202 |
| 11,043,444 B2 | 6/2021 | Ganti | |
| 11,242,241 B2 | 2/2022 | Menon | |
| 2002/0163782 A1 | 11/2002 | Cole | |
| 2002/0184907 A1 | 12/2002 | Vaiyapuri | |
| 2004/0023614 A1 | 2/2004 | Koplin | |
| 2004/0190251 A1 | 9/2004 | Prasher | |
| 2004/0218362 A1 | 11/2004 | Amaro | |
| 2004/0244405 A1 | 12/2004 | Kim | |
| 2004/0253130 A1 | 12/2004 | Sauciuc | |
| 2005/0074662 A1 | 4/2005 | Cho | |
| 2005/0089415 A1 | 4/2005 | Cho | |
| 2005/0110841 A1 | 5/2005 | Silverbrook | |
| 2005/0178529 A1 | 8/2005 | Suzuki | |
| 2005/0211418 A1 | 9/2005 | Kenny | |
| 2005/0225213 A1 | 10/2005 | Richards | |
| 2005/0266286 A1 | 12/2005 | Sato | |
| 2005/0280994 A1 | 12/2005 | Yazawa | |
| 2006/0147324 A1 | 7/2006 | Tanner | |
| 2006/0164805 A1 | 7/2006 | Meinders | |
| 2006/0208613 A1 | 9/2006 | Scher | |
| 2006/0232167 A1 | 10/2006 | Jordan | |
| 2006/0236710 A1 | 10/2006 | Vaiyapuri | |
| 2006/0250773 A1 | 11/2006 | Campbell | |
| 2006/0250774 A1 | 11/2006 | Campbell | |
| 2006/0260784 A1 | 11/2006 | Bezama | |
| 2007/0020124 A1 | 1/2007 | Singhal | |
| 2007/0048154 A1 | 3/2007 | Sapir | |
| 2007/0076375 A1 | 4/2007 | Mongia | |
| 2007/0235180 A1 | 10/2007 | Ouyang | |
| 2007/0274045 A1 | 11/2007 | Campbell | |
| 2008/0041574 A1 | 2/2008 | Arik | |
| 2008/0101965 A1 | 5/2008 | Zhang | |
| 2008/0111866 A1 | 5/2008 | Silverbrook | |
| 2008/0218972 A1 | 9/2008 | Sauciuc | |
| 2008/0304979 A1 | 12/2008 | Lucas | |
| 2009/0021908 A1 | 1/2009 | Patel | |
| 2009/0050294 A1 | 2/2009 | Fedorov | |
| 2009/0120621 A1 | 5/2009 | Sheinman | |
| 2009/0167109 A1 | 7/2009 | Tomita | |
| 2009/0174999 A1 | 7/2009 | Sauciuc | |
| 2009/0232685 A1 | 9/2009 | Kamitani | |
| 2010/0067191 A1 | 3/2010 | Arik | |
| 2010/0074775 A1 | 3/2010 | Yamamoto | |
| 2011/0063800 A1 | 3/2011 | Park | |
| 2011/0068799 A1 | 3/2011 | Wolf | |
| 2011/0122582 A1 | 5/2011 | Park | |
| 2011/0211020 A1 | 9/2011 | Silverbrook | |
| 2011/0259557 A1 | 10/2011 | Chao | |
| 2011/0277491 A1 | 11/2011 | Wu | |
| 2011/0304240 A1 | 12/2011 | Meitav | |
| 2012/0063091 A1 | 3/2012 | Dede | |
| 2012/0171062 A1 | 7/2012 | Kodama | |
| 2013/0157729 A1 | 6/2013 | Tabe | |
| 2013/0233523 A1 | 9/2013 | Parida | |
| 2014/0052429 A1 | 2/2014 | Kelkar | |
| 2014/0192485 A1 | 7/2014 | Rau | |
| 2014/0216696 A1 | 8/2014 | Donnelly | |
| 2015/0007965 A1 | 1/2015 | Joshi | |
| 2015/0009631 A1 | 1/2015 | Joshi | |
| 2015/0043164 A1 | 2/2015 | Joshi | |
| 2015/0173237 A1 | 6/2015 | Lin | |
| 2015/0308377 A1 | 10/2015 | Packard | |
| 2016/0358841 A1 | 12/2016 | Eid | |
| 2016/0377072 A1 | 12/2016 | Wu | |
| 2016/0377073 A1 | 12/2016 | Tanaka | |
| 2017/0146039 A1 | 5/2017 | Lin | |
| 2017/0276149 A1 | 9/2017 | Dusseau | |
| 2017/0292537 A1 | 10/2017 | Barak | |
| 2017/0363076 A1 | 12/2017 | Najafi | |
| 2018/0061737 A1 | 3/2018 | Arik | |
| 2018/0145010 A1 | 5/2018 | Fukuoka | |
| 2018/0146573 A1 | 5/2018 | Chen | |
| 2018/0146574 A1 | 5/2018 | Chen | |
| 2018/0187672 A1 | 7/2018 | Tanaka | |
| 2019/0067550 A1 | 2/2019 | Mou | |
| 2019/0101938 A1 | 4/2019 | Mou | |
| 2020/0049386 A1 | 2/2020 | Ganti | |
| 2020/0229320 A1 | 7/2020 | Mou | |

(56) References Cited

U.S. PATENT DOCUMENTS

| | | | |
|---|---|---|---|
| 2021/0144884 A1 | 5/2021 | Mou | |
| 2021/0180723 A1 | 6/2021 | Mukundan | |
| 2021/0183739 A1 | 6/2021 | Sathyamurthy | |

FOREIGN PATENT DOCUMENTS

| | | |
|---|---|---|
| CN | 204436756 | 7/2015 |
| CN | 104832407 | 8/2015 |
| CN | 106206490 | 12/2016 |
| CN | 106849747 | 6/2017 |
| CN | 107642483 | 1/2018 |
| TW | 200635493 | 10/2006 |
| TW | 201638469 | 11/2016 |
| TW | 542326 | 5/2017 |
| TW | 201814772 | 4/2018 |

OTHER PUBLICATIONS

H.Q. Li, "A High Frequency High Flow Rate Piezoelectrically Driven Mems Micropump", Solid-State Sensors, Actuators, and Microsystems Workshop, Jun. 4-8, 2000, pp. 69-72.

* cited by examiner

ENGINEERED ACTUATORS USABLE IN MEMS ACTIVE COOLING DEVICES

CROSS REFERENCE TO OTHER APPLICATIONS

This application is a continuation in part of pending U.S. patent application Ser. No. 16/915,912 entitled CENTRALLY PINNED MEMS-BASED PIEZOELCTRIC COOLING SYSTEM filed Jun. 29, 2020, which claims priority to U.S. Provisional Patent Application No. 62/945,001 entitled CENTRALLY ANCHORED MEMS-BASED ACTIVE COOLING SYSTEMS filed Dec. 6, 2019, both of which are incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
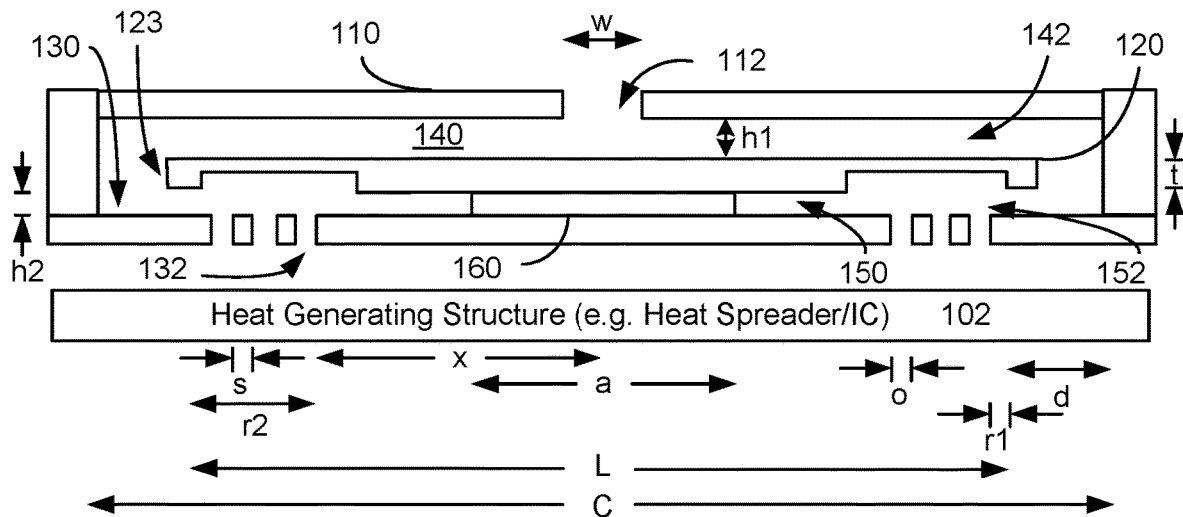
FIGS. 1A-1F depict an embodiment of an active cooling system including an engineered actuator.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated. Thus, additional cooling solutions capable of being used with smaller mobile devices as well as larger devices are desired.

Although described in the context of a cooling system, the techniques and/or devices described herein may be used in other applications. For example, the actuators may be used in other application. In addition, the devices are described in the context of centrally anchored actuators (i.e. cooling elements). In some embodiments, however, the actuator may be anchored along an edge. In some such embodiments, only a portion of the actuator (e.g. half) may be utilized.

An actuator usable in a cooling system is described. The actuator includes an anchored region and a cantilevered arm. The cantilevered arm extends outward from the anchored region. The cantilevered arm includes a step region, an extension region and an outer region. The step region extends outward from the anchored region and has a step thickness. The extension region extends outward from the step region and has an extension thickness less than the step thickness. The outer region extends outward from the extension region and has an outer thickness greater than the extension thickness. In some embodiments, the outer thickness is at least fifty micrometers and not more than two hundred micrometers thicker than the extension thickness. The outer region may have a width of at least one hundred micrometers and not more than three hundred micrometers. The extension region has a length extending outward from the step region of at least 0.5 millimeter and not more than 1.5 millimeters in some embodiments.

In some embodiments, the cantilevered arm further includes an additional step region between the step region and the extension region. The additional step region has an additional step thickness less than the step thickness and greater than the extension thickness.

In some embodiments, at least one of the step region, the extension region and the outer region of the actuator includes recess(es) therein. The recess(es) include a taper such that a width of the recess increases with distance from the anchored region. For example, the taper might be selected from a linear taper, a quadratic taper, and a cubic taper. Other tapers are possible. In some embodiments, the actuator includes a cover configured such that the recess(es) are internal to the actuator.

In some embodiments, the actuator includes an additional cantilevered arm. The additional cantilevered arm extends outward from the anchored region opposite to the cantilevered arm. The additional cantilevered arm includes additional step, extension and outer regions. The additional step region has an additional step thickness. The additional extension region extends outward from the additional step region and has an additional extension thickness less than the additional step thickness. The additional outer region extends outward from the additional extension region and has an additional outer thickness greater than the additional extension thickness.

The actuator is usable as a cooling element in a cooling system. The cooling system includes an anchor and the actuator. The cooling element (i.e. the actuator) is affixed to the anchor at the anchored region. The cooling element is configured to undergo vibrational motion when actuated to drive a fluid toward a heat-generating structure. In some embodiments, the cooling system includes an orifice plate having orifices therein. The orifice plate is disposed between the cooling element and the heat-generating structure. In some embodiments, the cooling system includes cell walls configured such that a top chamber is formed between a portion of the plurality of cell walls and the cooling element and a bottom chamber is formed between the plurality of cell walls, the orifice plate, and the cooling element. The top chamber is in fluid communication with the bottom chamber.

In some embodiments, a method for cooling a heat-generating structure is described. The method includes driving a cooling element to induce a vibrational motion at a frequency. The cooling element is the actuator described herein in some embodiments. In some embodiments, the cooling element is driven substantially at a structural resonant frequency for the cantilevered arm. In some embodiments, the cooling element is driven at or near at a fluidic resonant frequency.

Figure 1B:
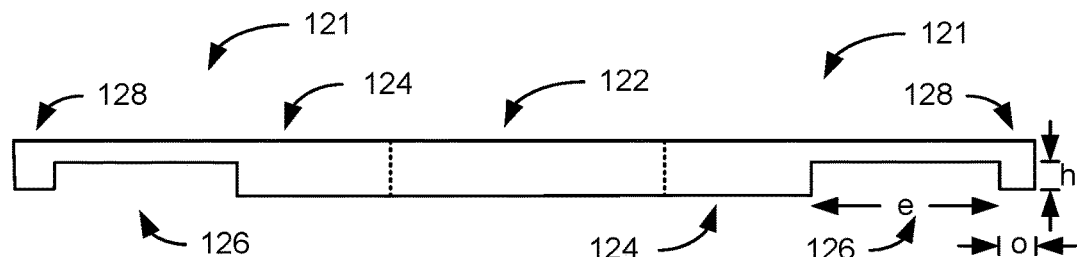

FIGS. 1A-1F are diagrams depicting an exemplary embodiment of active cooling system 100 usable with heat-generating structure 102 and including a centrally anchored cooling element 120. For clarity, only certain components are shown. FIGS. 1A-1F are not to scale. Although shown as symmetric, cooling system 100 need not be. FIGS. 1A and 1C-1F depict cooling systems using an actuator, or cooling element, 120. FIG. 1B is a side view of cooling element 120.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 123) vibrate when actuated. In some embodiments, tip 123 of cooling element 120 includes a portion of the perimeter furthest from anchor 160 and undergoes the largest deflection during actuation of cooling element 120. For clarity, only one tip 123 of cooling element 120 is labeled in FIG. 1A.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electromechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, the total height does not exceed two hundred and fifty micrometers. In some embodiments, this total height is not more than 1.1 millimeters. In some embodiments, the total height does not exceed one millimeter. Similarly, the distance between the bottom of orifice plate 130 and the top of heat-generating structure 102, y, may be small. In some embodiments, y is at least two hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 123), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired the acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Cooling element 120 includes an anchored region 122 and cantilevered arms 121. Anchored region 122 is supported (e.g. held in place) in cooling system 100 by anchor 160. Cantilevered arms 121 undergo vibrational motion in response to cooling element 120 being actuated. Each cantilevered arm 121 includes step region 124, extension region 126 and outer region 128. For clarity, cantilevered arms 121, step region 124, extension region 126, and outer region 128 are only labeled in FIG. 1B. In the embodiment shown in FIGS. 1A-1F, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. The outer thickness of outer region 128 and the step thickness of step region 124 are each at least three hundred twenty and not more than three hundred sixty micrometers. In other embodiments, other thicknesses are possible. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. cantilevered arms 121 including tip 123) move in a cantilevered fashion. Thus, cantilevered arms 121 of cooling element 120 may move in a manner analogous to the wings of a butterfly (i.e. in-phase) and/or analogous to a seesaw (i.e. out-of-phase). Thus, the cantilevered arms 121 of cooling element 120 that vibrate in a cantilevered fashion do so in-phase in some embodiments and out-of-phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A and 1C-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/50 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be cantilevered arm(s) 121 in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 123 of cooling element 120 and near the connection between top chamber 140 and bottom chamber 150). The distance between these two regions is C/2. Thus, $C/2 = n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of cooling element 120, in some embodiments, it is also approximately true that $L/2 = n\lambda/4$, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 123 that suction in the upstroke of cooling element 120 (tip 123 moves away from orifice plate 13) that would pull fluid into bottom chamber 150 through orifices 132 is reduced. The locations of orifices are also desired to be sufficiently close to tip 123 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 123 and not more than a distance, r2, from tip 123 of cooling element 120. In some embodiments r1 is at least one hundred micrometers (e.g. r1≥100 μm) and r2 is not more than one millimeter (e.g. r2≤1000 μm). In some embodiments, orifices 132 are at least two hundred micrometers from tip 123 of cooling element 120 (e.g. r1≥200 μm). In some such embodiments, orifices 132 are at least three hundred micrometers from tip 123 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may be a stainless steel, Ni alloy and/or Hastelloy substrate. In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Figure 1C:
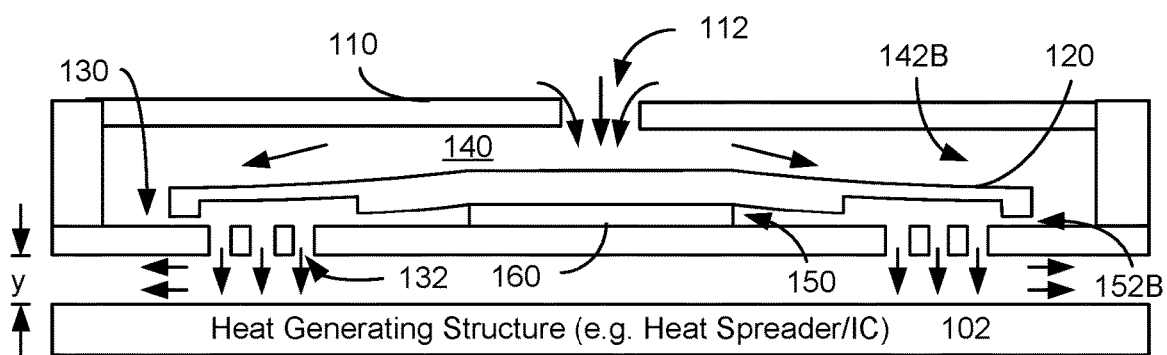
Figure 1D:
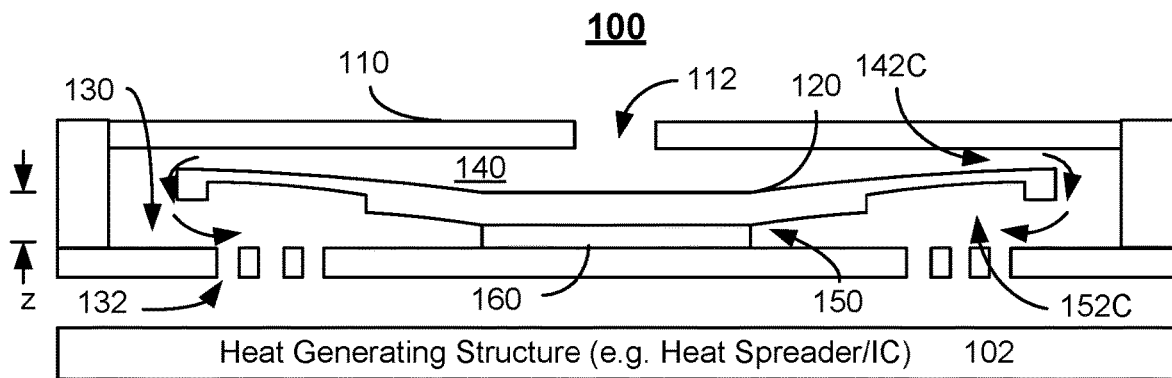

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that cantilevered arms 121 and tip 123 move away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1C. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat generating structure 102 is shown by unlabeled arrows in FIG. 1C.

Cooling element 120 is also actuated so that cantilevered arms 121 and thus tip 123 move away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1D. Thus, the fluid is driven from top chamber 140 (e.g. the periphery of chamber 140/150) to bottom chamber 150. Thus, when tip 123 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 10.

The motion between the positions shown in FIGS. 1C and 1D is repeated. Thus, cooling element 120 undergoes vibrational motion indicated in FIGS. 1A and 1C-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. In some embodiments, this corresponds to the structural resonance of cantilevered arms 121. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Figure 1E:
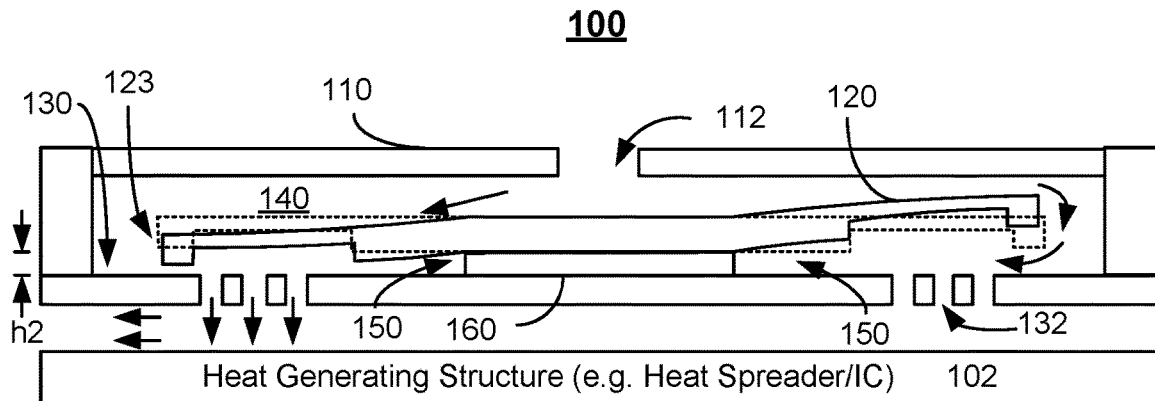
Figure 1F:
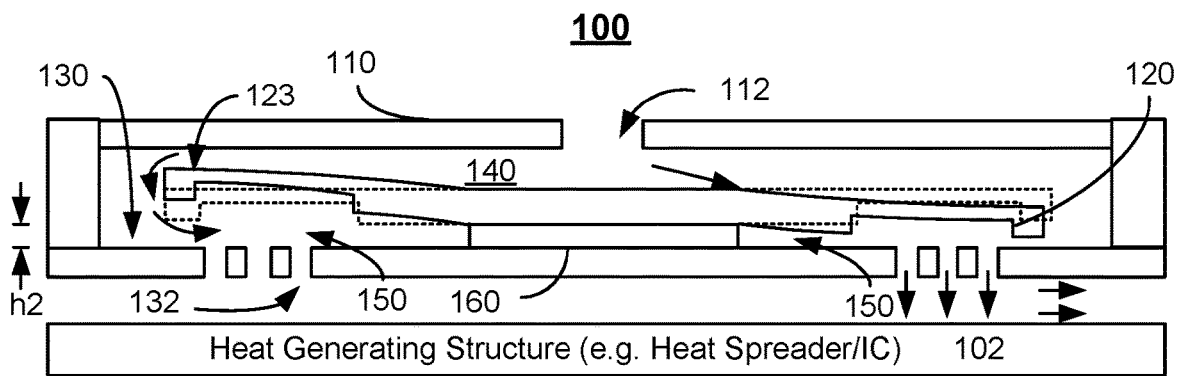
Figure 2A:
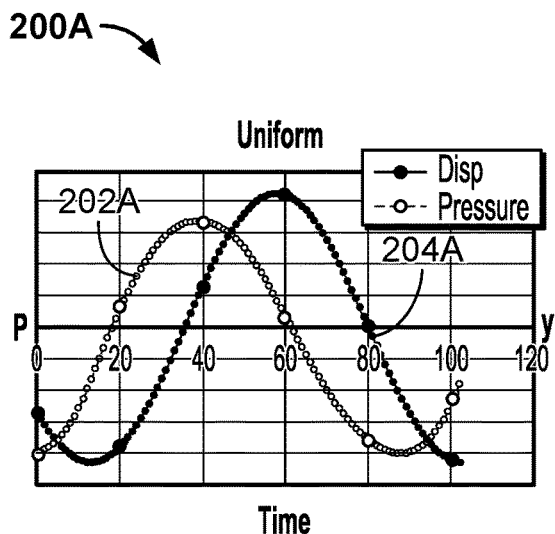
FIGS. 2A-2E depict performance metrics for embodiments of actuators usable in active cooling systems including centrally anchored cooling elements.
Figure 2B:
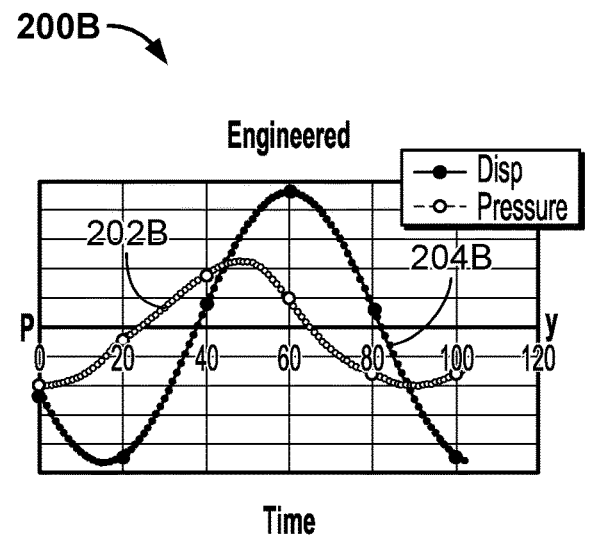
Figure 2C:
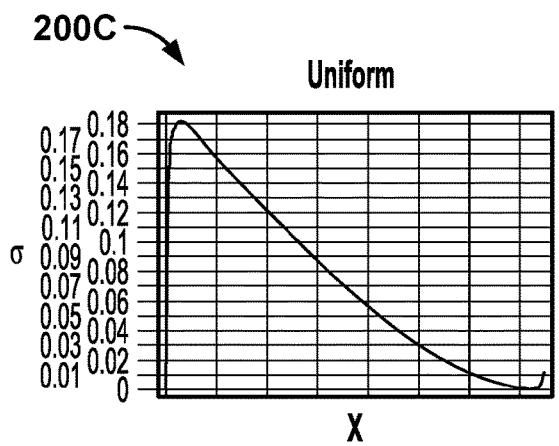
Figure 2D:
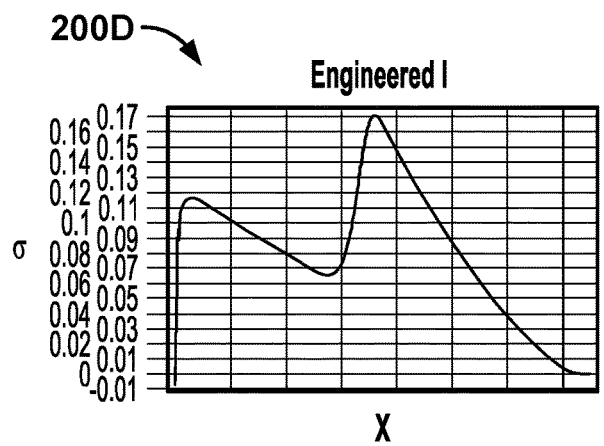
Figure 2E:
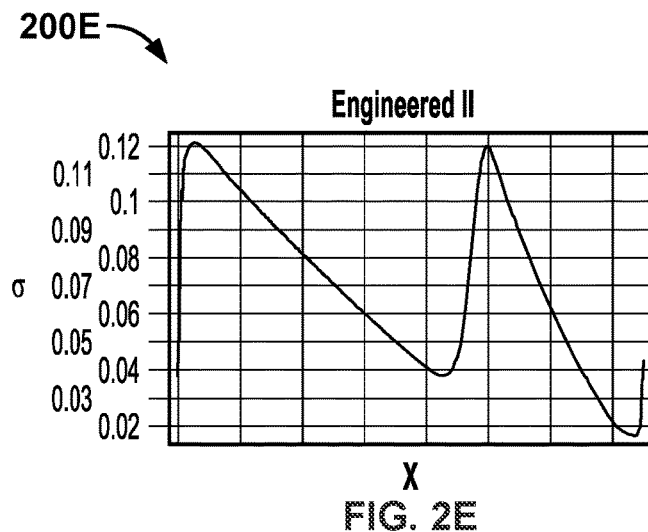

FIGS. 1E-1F depict an embodiment of active cooling system 100 including centrally anchored cooling element 120 in which the cooling element is driven out-of-phase. More specifically, cantilevered arms 121 of cooling element 120 on opposite sides of anchor 160 (and thus on opposite sides of the central, anchored region 122 of cooling element 120 that is supported by anchor 160) are driven to vibrate out-of-phase. In some embodiments, cantilevered arms 121 of cooling element 120 on opposite sides of anchor 160 are driven at or near one hundred and eighty degrees out-of-phase. Thus, one cantilevered arm 121 of cooling element 120 vibrates toward top plate 110, while the other cantilevered arm 121 of cooling element 120 vibrates toward orifice plate 130/heat-generating structure 102. Movement of a cantilevered arms 121 of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. The movement of fluid is shown by unlabeled arrows in FIGS. 1E and 1F.

The motion between the positions shown in FIGS. 1E and 1F is repeated. Thus, cooling element 120 undergoes vibrational motion indicated in FIGS. 1A, 1E, and 1F, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Using the cooling system 100 actuated for in-phase vibration or out-of-phase vibration, fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120 may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120 does not physically contact top plate 110 or orifice plate 130 during vibration. Thus, resonance of cooling element 120 may be more readily maintained. More specifically, physical contact between cooling element 120 and other structures disturbs the resonance conditions for cooling element 120. Disturbing these conditions may drive cooling element 120 out of resonance. Thus, additional power would need to be used to maintain actuation of cooling element 120. Further, the flow of fluid driven by cooling element 120 may decrease. These issues are avoided through the use of pressure differentials and fluid flow as discussed above. The benefits of improved, quiet cooling may be achieved with limited additional power. Further, out-of-phase vibration of cooling element 120 allows the position of the center of mass of cooling element 100 to remain more stable. Although a torque is exerted on cooling element 120, the force due to the motion of the center of mass is reduced or eliminated. As a result, vibrations due to the motion of cooling element 120 may be reduced. Moreover, efficiency of cooling system 100 may be improved through the use of out-of-phase vibrational motion for the two sides of cooling element 120. For out-of-phase vibration of cantilevered arms 121, vibrations through cooling system 100 may also be reduced. Consequently, performance of devices incorporating the cooling system 100 may be improved. Further, cooling system 100 may be usable in other applications (e.g. with or without heat-generating structure 102) in which high fluid flows and/or velocities are desired.

Use of engineered cooling element 120 may further improve performance of cooling system 100. Extension region 126 is thinner than step region 124 and outer region 128. This results in a cavity in the bottom of cooling element 120 corresponding to extension region 126. The presence of this cavity aids in improving the efficiency of cooling system 100. As discussed with respect to FIGS. 1A and 1C-1F, cantilevered arms 121 vibrate towards top plate 110 in an upstroke and away from top plate 110 in a downstroke. When a cantilevered arm 121 moves toward top plate 110, higher pressure fluid in top chamber 140 resists the motion of cantilevered arm 121. Furthermore, suction in bottom chamber 150 also resists the upward motion of cantilevered arm 121 during the upstroke. In the downstroke of cantilevered arm 121, increased pressure in the bottom chamber 150 and suction in top chamber 140 resist the downward motion of cantilevered arm 121. However, the presence of the cavity in cantilevered arm 121 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 121 may more readily move through the fluid. This may be achieved while substantially maintaining a higher pressure in top chamber 140, which drives the fluid flow through cooling system 100. Thus, efficiency may be improved.

Moreover, the presence of outer region 128 may improve the ability of cantilevered arm 121 to move through the fluid being driven through cooling system 100. Outer region 128 has a higher mass and thus a higher momentum. Consequently, outer region 128 may improve the ability of cantilevered arms 121 to move through the fluid being driven through cooling system 100. The magnitude of the deflection of cantilevered arm 121 may also be increased. These benefits may be achieved while maintaining the stiffness of cantilevered arms 121 through the use of thicker step region 124. Thus, efficiency of cooling system 100 may again be improved.

The improvement may also be understood as follows. Q can be considered a measure of the efficiency of cooling element 120. The value of Q is determined at least in part by the interaction of cooling element 120 with the surrounding fluid (i.e. a gas such as air or a liquid), structural losses within cooling element 120, the anchoring of cooling element 120, and/or other characteristics. Q can be considered to be defined by $\delta_{res}=Q*\delta_{static}$, where $\delta_{res}$ is the deflection at resonance and $\delta_{static}$ is the corresponding static deflection. The higher the value of Q, the higher the deflection at resonance and the more slowly the deflection decays (i.e. the lower the damping). Because of the engineered configuration of cooling element 120, the cooling element is better able to move through the surrounding fluid. Consequently, a higher static deflection may be achieved, the deflection may be better amplified at resonance, the power consumed to drive cooling element 120 may be reduced, and the deflection may die out more slowly (i.e. be subject to reduced damping). Q of cooling element 120 and, therefore, efficiency of cooling system 100 may thus be enhanced by the configuration of cooling element 120.

Use of engineered cooling element 120 may also improve reliability of cooling system 100. Because of its reduced thickness, extension region 126 may be less stiff than outer region 128 and step region 124. This reduction in stiffness reduces the stress on cooling element 120 during vibration. Cooling element 120 may be less likely to fail. Reliability of cooling system 100 may, therefore, be improved.

For example, FIGS. 2A-2E depicts exemplary embodiments of graphs 200A, 200B, 200C, 200D and 200E related to performance of the cooling element 200. Graphs 200A, 200B, 200C, 200D and 200E are for explanatory purposes only and not intended to represent performance of all embodiments of cooling element 120 and/or cooling system 100. Graph 200A includes curves depicting the deflection 204A (y) and pressure 202A (P) in chambers 140 and 150 for a cooling element having uniform thickness. Graph 200B includes curves depicting pressure 202B (P) in chambers 140 and 150 and deflection 204B (y) for cooling element 120. The magnitudes of deflection for curves 204A and 204B are the same in the embodiments shown. In some embodiments, the magnitude of deflection is four micrometers. Because of the presence of the cavity under extension region 126, the pressure curve 202B indicates that the pressure developed in the chambers for cooling element 120 is less than the pressure indicated by pressure curve 202A for a uniform actuator. Cantilevered arms 121 may thus more readily and efficiently move through the fluid in cooling system 100. Efficiency may thus be improved.

Similarly, graphs 200C, 200D and 200E depicts the stress (σ) versus deflection (y) of the cooling element for a uniform cooling element (graph 200C) and two embodiments of cooling element 120 (graphs 200D and 200E). Graph 200C indicates a single high stress region close to the edge of anchor 160. This is the location that undergoes the highest stress as the uniform cooling element deflects. Graphs 200D and 200E indicate that the stress for cooling element 120 is concentrated at two locations: near anchor 160 (i.e. where cooling element 120 is free to vibrate) and near the transition between step region 124 and extension region 126. However, the configuration of cooling element 120 reduces the magnitude of the stress experienced by cooling element 120 at these regions. Because cooling element 120 is subjected to less stress, cooling element 120 may be less likely to fail. Consequently, reliability may be improved.

FIGS. 3A-3D depict plan views of embodiments of cooling systems 300A, 300B, 300C and 300D analogous to active cooling systems such as cooling system 100. FIGS. 3A-3D are not to scale. For simplicity, only portions of cooling elements 320A, 320B, 320C and 320D and anchors 360A, 360B, 360C and 360D, respectively, are shown. Cooling elements 220A, 320B, 320C and 320D are analogous to cooling element 120. Thus, the sizes and/or materials used for cooling elements 320A, 320B, 320C and/or 320D may be analogous to those for cooling element 120. Anchors (support structures) 360A, 360B, 360C and 360B Dare analogous to anchor 160 and are indicated by dashed lines.

Figure 3A:
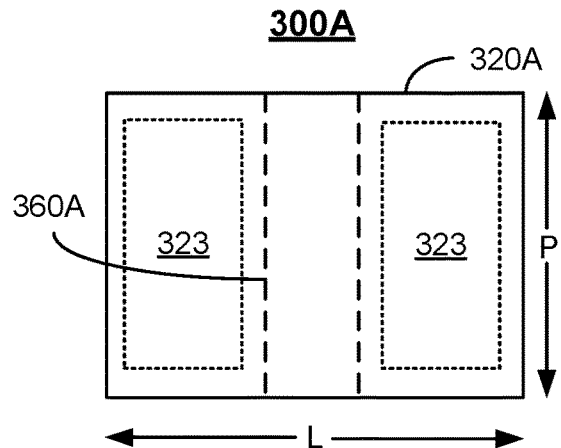
FIGS. 3A-3D depict embodiments of actuators usable in active cooling systems including centrally anchored cooling elements.
Figure 3B:
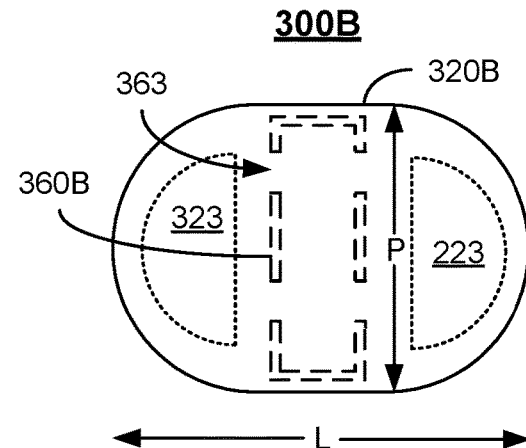

For cooling elements 320A and 320B, anchors 360A and 360B are centrally located and extend along a central axis of cooling elements 320A and 320B, respectively. Thus, the cantilevered portions (i.e. cantilevered arms) that are actuated to vibrate are to the right and left of anchors 360A and 360B. In some embodiments, cooling element(s) 320A and/or 320B are continuous structures, two portions of which are actuated (e.g. the cantilevered portions outside of anchors 360A and 360B). In some embodiments, cooling element(s) 320A and/or 320B include separate cantilevered portions each of which is attached to the anchors 360A and 360B, respectively, and actuated. Cantilevered portions of cooling elements 320A and 320B may thus be configured to vibrate in a manner analogous to the wings of a butterfly (in-phase) or to a seesaw (out-of-phase). In FIGS. 3A and 3B, L is the length of the cooling element, analogous to that depicted in FIGS. 1A-1F. Also in FIGS. 3A and 3B, the depth, P, of cooling elements 320A and 320B is indicated.

Also shown by dotted lines in FIGS. 3A-3B are piezoelectric 323. Piezoelectric 223 is used to actuate cooling elements 320A and 320B. Although described in the context of a piezoelectric, another mechanism for actuating cooling elements 360A and 360B can be utilized. Such other mechanisms may be at the locations of piezoelectric 323 or may be located elsewhere. In cooling element 360A, piezoelectric 323 may be affixed to cantilevered portions or may be integrated into cooling element 320A. Further, although piezoelectric 323 is shown as having particular shapes and sizes in FIGS. 3A and 3B, other configurations may be used.

In the embodiment shown in FIG. 3A, anchor 360A extends the entire depth of cooling element 320A. Thus, a portion of the perimeter of cooling element 360A is pinned. The unpinned portions of the perimeter of cooling element 360A are part of the cantilevered sections that undergo vibrational motion. In other embodiments, anchor need not extend the entire length of the central axis. In such embodiments, the entire perimeter of the cooling element is unpinned. However, such a cooling element still has cantilevered sections configured to vibrate in a manner described herein. For example, in FIG. 3B, anchor 360B does not extend to the perimeter of cooling element 320B. Thus, the perimeter of cooling element 320B is unpinned. However, anchor 360B still extends along the central axis of cooling element 320B. Cooling element 320B is still actuated such that cantilevered portions vibrate (e.g. analogous to the wings of a butterfly).

Although cooling element 320A is depicted as rectangular, cooling elements may have another shape. In some embodiments, corners of cooling element 320A may be rounded. Cooling element 320B of FIG. 3B has rounded cantilevered sections. Other shapes are possible. In the embodiment shown in FIG. 3B, anchor 360B is hollow and includes apertures 363. In some embodiments, cooling element 320B has aperture(s) in the region of anchor 360B. In some embodiments, cooling element 320B includes multiple portions such that aperture(s) exist in the region of anchor 360B. As a result, fluid may be drawn through cooling element 320B and through anchor 360B. Thus, cooling element 320B may be used in place of a top plate, such as top plate 110. In such embodiments, apertures in cooling element 320B and apertures 363 may function in an analogous manner to vent 112. Further, although cooling elements 300A and 300B are depicted as being supported in a central region, in some embodiments, one cantilevered section of the cooling element 320A and/or 320B might be omitted. In such embodiments, cooling element 320A and/or 320B may be considered to be supported, or anchored, at or near one edge, while at least part of at least the opposing edge is free to undergo vibrational motion. In some such embodiments, the cooling element 320A and/or 320B may include a single cantilevered section that undergoes vibrational motion.

Figure 3C:
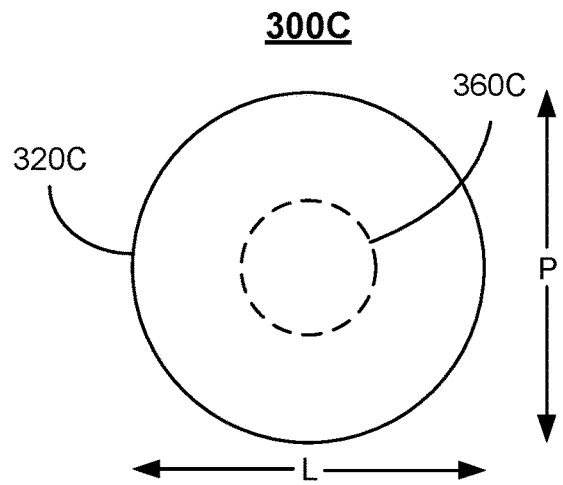
Figure 3D:
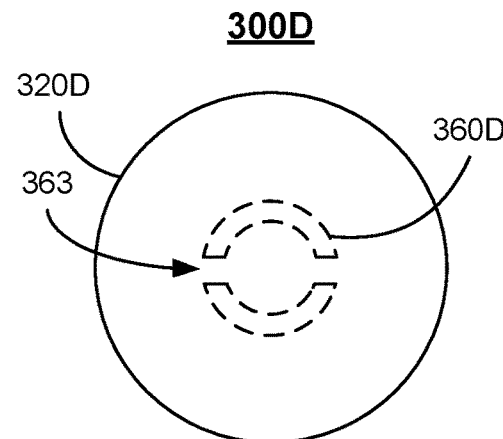

FIGS. 3C-3D depict plan views of embodiments of cooling systems 300C and 300D analogous to active cooling systems such as cooling system 100. For simplicity, only cooling elements 320C and 320D and anchors 360C and 360D, respectively, are shown. Cooling elements 320C and 320D are analogous to cooling element 120. Thus, the sizes and/or materials used for cooling elements 320C and/or 320D may be analogous to those for cooling element 120. Anchors 360A and 360D are analogous to anchor 160 and are indicated by dashed lines.

For cooling elements 320C and 320D, anchors 360C and 360D, respectively, are limited to a central region of cooling elements 320C and 320D, respectively. Thus, the regions surrounding anchors 360C and 360D undergo vibrational motion. Cooling elements 320C and 320D may thus be configured to vibrate in a manner analogous to a jellyfish or similar to the opening/closing of an umbrella. In some embodiments, the entire perimeter of cooling elements 320C and 320D vibrate in phase (e.g. all move up or down together). In other embodiments, portions of the perimeter of cooling elements 320C and 320D vibrate out of phase. In FIGS. 3C and 3D, L is the length (e.g. diameter) of the cooling element, analogous to that depicted in FIGS. 1A-1F. Although cooling elements 320C and 320D are depicted as circular, cooling elements may have another shape. Further, a piezoelectric (not shown in FIGS. 3C-3D) and/or other mechanism may be used to drive the vibrational motion of cooling elements 320C and 320D.

In the embodiment shown in FIG. 3D, the anchor 360D is hollow and has apertures 363. In some embodiments, cooling element 320D has aperture(s) in the region of anchor D. In some embodiments, cooling element 320D includes multiple portions such that aperture(s) exist in the region of anchor 360D. As a result, fluid may be drawn through cooling element 320D and through anchor 360D. The fluid may exit through apertures 363. Thus, cooling element 320D may be used in place of a top plate, such as top plate 110. In such embodiments, apertures in cooling element 320D and apertures 363 may function in an analogous manner to vent 112.

Cooling systems such as cooling system 100 can utilize cooling element(s) 320A, 320B, 320C, 320D and/or analogous cooling elements. Such cooling systems may also share the benefits of cooling system 100. Cooling systems using cooling element(s) 320A, 320B, 320C, 320D and/or analogous cooling elements may more efficiently drive fluid toward heat-generating structures at high speeds. Consequently, heat transfer between the heat-generating structure and the moving fluid is improved. Because the heat-generating structure is more efficiently cooled, the corresponding device may exhibit improved operation, such as running at higher speed and/or power for longer times. Cooling systems employing cooling element(s) 320A, 320B, 320C, 320D and/or analogous cooling elements may be suitable for use in smaller and/or mobile devices in which limited space is available. Performance of such devices may thus be improved. Because cooling element(s) 320A, 320B, 320C, 320D and/or analogous cooling elements may be vibrated at frequencies of 15 kHz or more, users may not hear any noise associated with actuation of cooling elements. If driven at or near the acoustic and/or structural resonance frequencies for the cooling element(s) 320A, 320B, 320C, 320D and/or analogous cooling elements, the power used in operating cooling systems may be significantly reduced. Cooling element(s) S20A, 320B, 320C, 320D and/or analogous cooling elements may not physically contact the plates during use, allowing resonance to be more readily maintained. The benefits of improved, quiet cooling may be achieved with limited additional power. Consequently, performance of devices incorporating the cooling element(s) 320A, 320B, 320C, 320D and/or analogous cooling elements may be improved.

Figure 4A:
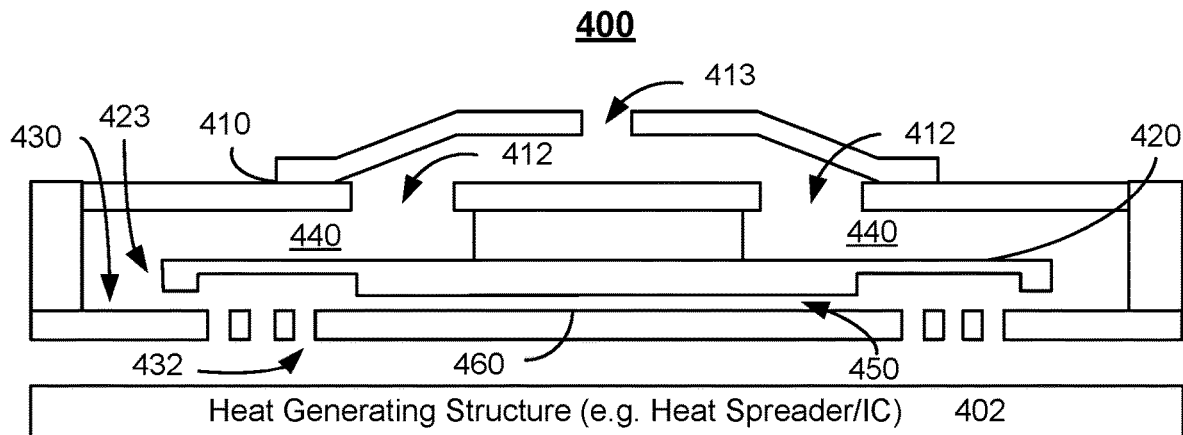
FIGS. 4A-4B depict an embodiment of an active cooling system including a engineered actuator.
Figure 4B:
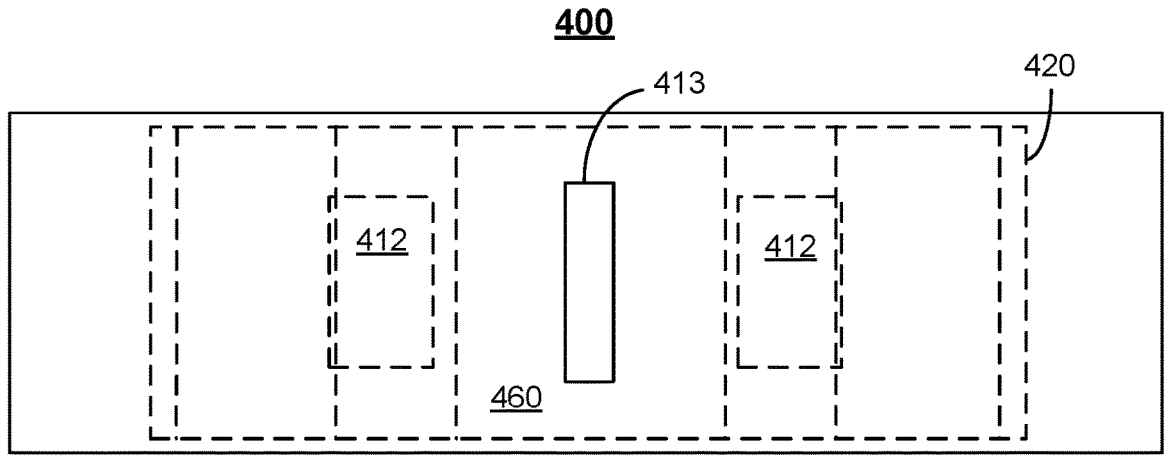

FIGS. 4A-4B an depict embodiments of active cooling systems 400 including a top centrally anchored cooling element. FIG. 4A depicts a side view of cooling system 400 in a neutral position. FIG. 4B depicts a top view of cooling system 400. FIGS. 4A-4B are not to scale. For simplicity, only portions of cooling system 400 is shown. Referring to FIGS. 4A-4B, cooling system 400 is analogous to cooling system 100. Consequently, analogous components have similar labels. For example, cooling system 400 is used in conjunction with heat-generating structure 402, which is analogous to heat-generating structure 102.

Cooling system 400 includes top plate 410 having vents 412, cooling element 420, orifice plate 430 including orifices 432, top chamber 440 having a gap, bottom chamber 450 having a gap and anchor (i.e. support structure) 460 that are analogous to top plate 110 having vent 112, cooling element 120, orifice plate 130 including orifices 132, top chamber 140 having gap 142, bottom chamber 150 having gap 152 and anchor (i.e. support structure) 160, respectively. Thus, cooling element 420 is centrally supported by anchor 460 such that at least a portion of the perimeter of cooling element 420 is free to vibrate. In some embodiments, anchor 460 extends along the axis of cooling element 420 (e.g. in a manner analogous to anchor 360A and/or 360B). In other embodiments, anchor 460 is only near the center portion of cooling element 420 (e.g. analogous to anchor 360C and/or 360D). Although not explicitly labeled in FIGS. 4A and 4B, cooling element 420 includes an anchored region and cantilevered arms including step region, extension region and outer regions analogous to anchored region 122, cantilevered arms 121, step region 124, extension region 126 and outer region 128, respectively. In some embodiments, cantilevered arms of cooling element 420 are driven in-phase. In some embodiments, cantilevered arms of cooling element 420 are driven out-of-phase.

Anchor 460 supports cooling element 420 from above. Thus, cooling element 420 is suspended from anchor 460. Anchor 460 is suspended from top plate 410. Top plate 410 includes vent 413. Vents 412 on the sides of anchor 460 provide a path for fluid to flow into sides of chamber 440.

As discussed above with respect to cooling system 100, cooling element 420 may be driven to vibrate at or near the structural resonant frequency of cooling element 420. Further, the structural resonant frequency of cooling element 420 may be configured to align with the acoustic resonance of the chamber 440/450. The structural and acoustic resonant frequencies are generally chosen to be in the ultrasonic range. For example, the vibrational motion of cooling element 420 may be at the frequencies described with respect to cooling system 100. Consequently, efficiency and flow rate may be enhanced. However, other frequencies may be used.

Cooling system 400 operates in an analogous manner to cooling system 100. Cooling system 400 thus shares the benefits of cooling system 100. Thus, performance of a device employing cooling system 400 may be improved. The use of cooling element 420 configured in a manner analogous to cooling element 120 may improve efficiency and reliability. In addition, suspending cooling element 420 from anchor 460 may further enhance performance. In particular, vibrations in cooling system 400 that may affect other cooling cells (not shown), may be reduced. For example, less vibration may be induced in top plate 410 due to the motion of cooling element 420. Consequently, cross talk between cooling system 400 and other cooling systems (e.g. other cells) or other portions of the device incorporating cooling system 400 may be reduced. Thus, performance may be enhanced.

Figure 5:
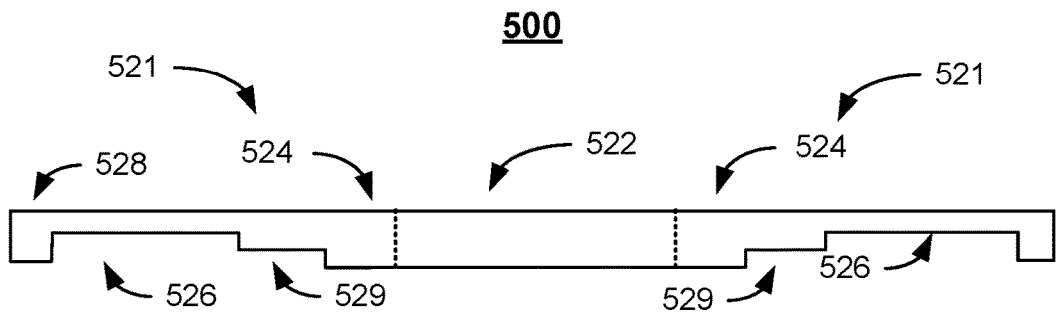
FIG. 5 depicts an embodiment of an engineered actuator.

FIG. 5 depicts a side view of an embodiment of cooling element, or actuator, 520. FIG. 5 is not to scale. Cooling element 520 is analogous to cooling element 120. Thus, cooling element 520 includes anchored region 522 and cantilevered arms 521 that are analogous to anchored region 122 and cantilevered arms 121. Anchored region 522 is held in place in a cooling system, such as cooling system(s) 100 and/or 400, by an anchor such as anchor 160 and/or 460. Cantilevered arms 521 undergo vibrational motion in response to cooling element 520 being driven. Each cantilevered arm 521 includes step region 524, extension region 526 and outer region 528 analogous to step region 124, extension region 124 and outer region 128, respectively. In the embodiment shown, anchored region 522 is centrally located. Step region 524 extends outward from anchored region 522. Extension region 526 extends outward from step region 524. Outer region 528 extends outward from extension region 526. In other embodiments, anchored region 522 may be at one edge of the actuator and outer region 528 at the opposing edge. In such embodiments, the actuator is edge anchored. Extension region 526, step region 524 and outer region 528 may have dimensions analogous to those of extension region 126, step region 124 and outer region 128, respectively. In addition, as described above with respect to outer region 128, outer region 528 has a higher mass per unit distance from anchored region 522 than extension region 526.

Each cantilevered arm 521 also includes additional step region 529. Additional step region 529 is between step region 524 and extension region 526. The thickness of additional step region 529 is between the step thickness of step region 524 and the extension thickness of extension region 526. The range of thicknesses for additional step region may be modified based upon the desired frequency at which cooling element 520 vibrates.

Cooling element 500 operates in a cooling system, such as cooling system(s) 100 and/or 400, in an analogous manner to cooling element 120. Cooling systems incorporating cooling element 500 thus shares the benefits of cooling system 100. Thus, performance of a device employing such a cooling system may be improved. The use of cooling element 520 may further improve efficiency and reliability. Thus, performance may be enhanced.

Figure 6A:
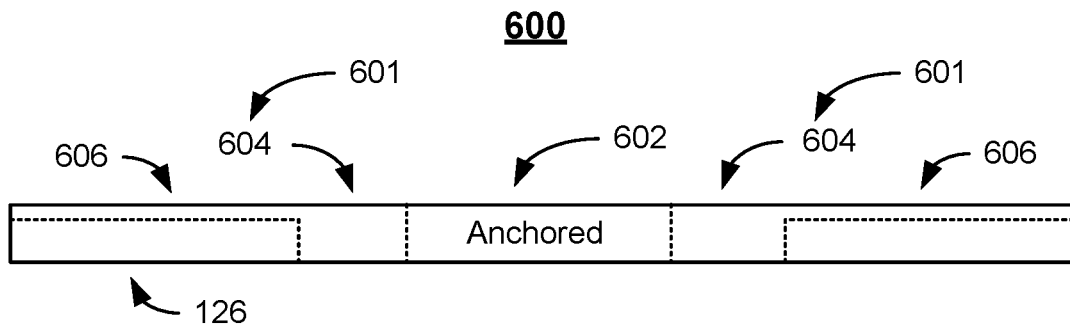
FIGS. 6A-6B depict an embodiment of an engineered actuator.
Figure 6B:
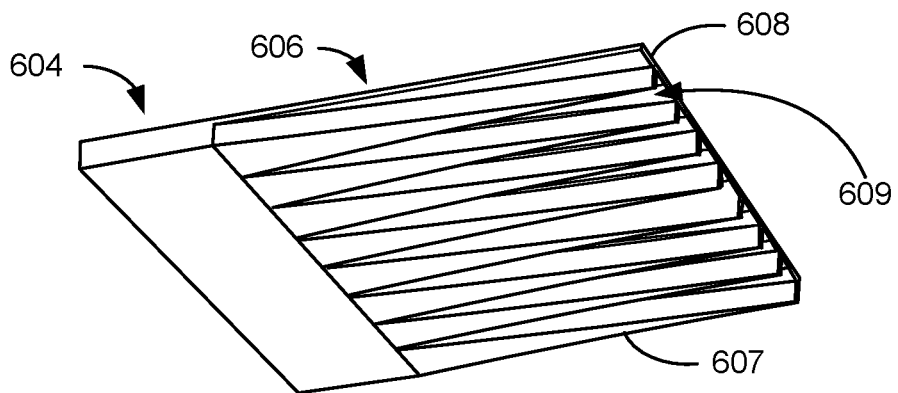

FIGS. 6A-6B depict an embodiment of engineered actuator 600 usable as a cooling element, for example, in cooling system(s) 100 and/or 400. Consequently, actuator 600 is described as cooling element 600. FIGS. 6A-6B are not to scale. FIG. 6A depicts a side view of cooling element 600 including anchored region 602 and cantilevered arms 601. FIG. 6B depicts a bottom perspective view of cantilevered arm 601. Anchored region 602 may be used to support or hold cooling element 600 in place in a cooling system, such as cooling system(s) 100 and/or 400, by an anchor such as anchor 160 and/or 460. Cantilevered arms 601 undergo vibrational motion in response to cooling element 600 being driven. Each cantilevered arm 601 includes step region 604 and recessed region 606. In the embodiment shown, anchored region 602 is centrally located. Step region 604 extends outward from anchored region 602. Recessed region 606 extends outward from step region 604. In other embodiments, anchored region 602 may be at one edge of the actuator and recessed region 606 may terminate at the opposing edge. In such embodiments, the actuator is edge anchored. Further, other regions (not shown) may be included in actuator 600.

Recessed region 606 includes tapers 607, top edge (or cover) 608, and recesses 609. Recesses 609 between tapers 607 are depressions in cooling element 600. Thus, if cooling element 600 is utilized in a cooling system, such as cooling system(s) 100 and/or 400, recesses 609 provide cavities that can be viewed as increasing the size of the bottom chamber. Tapers 608 have a width that decreases with increasing distance from anchored region 602. Similarly, recesses 609 have a recess width that increases with increasing distance from anchored region 602. For example, the taper (i.e. the change of the widths) might be selected from a linear taper, a quadratic taper, and a cubic taper. Other tapers are possible. In some embodiments, tapers 607 and recesses 609 may have constant width (i.e. be untapered).

In operation, cooling element 600 functions in an analogous manner to cooling element 120. Thus, cooling element 600 can be driven to undergo vibrational motion. When used in a cooling system, such as cooling system(s) 100 and/or 400, cooling element 600 may drive fluid at the velocities described herein. Thus, cooling element 600 may be utilized to efficiently cool heat-generating structures. Moreover, recesses 609 may reduce the suction/pressure increase during the upstroke/downstroke of cantilevered arm 601 in a manner analogous to extension region 126 of cooling element 120. Thus, efficiency may be further increased. Further, tapers 607 may reduce the stress to which cantilevered arm 601 is subjected during vibrational motion. Consequently, reliability of cooling element 600 may be improved.

Figure 7:
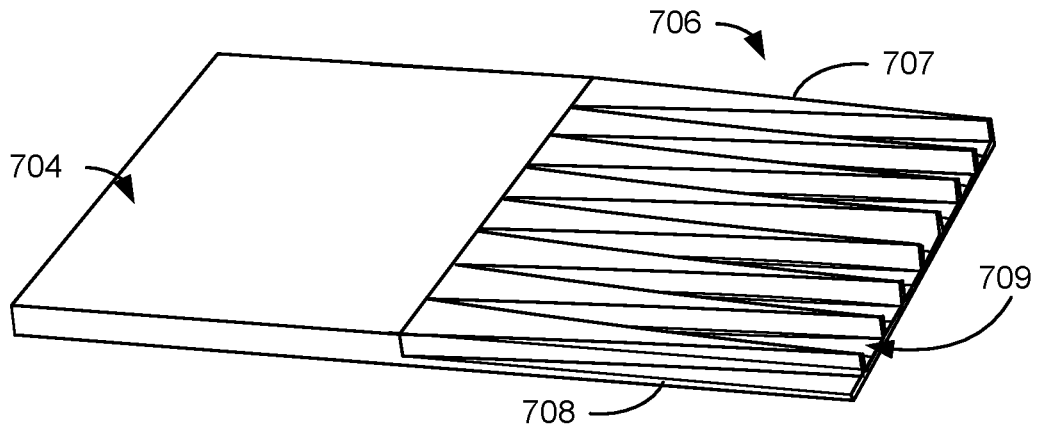
FIGS. 7-13 depict embodiments of an engineered actuator.

FIG. 7 is a perspective view of an embodiment of cantilevered arm 701 that may be part of a cooling element, such as cooling element 600. FIG. 7 is not to scale. Cantilevered arm 701 may be adjacent to an anchored region (not shown) that is may be used to support or hold the cooling element of which cantilevered arm 701 is a part. Cantilevered arm 701 may be part of a centrally anchored cooling element or part of an edge anchored cooling element in some embodiments. Cantilevered arm 701 undergoes vibrational motion in response to such a cooling element being driven. Cantilevered arm 701 includes step region 704 and recessed region 706. Step region 704 extends outward from an anchored region (not shown). Recessed region 706 extends outward from step region 704. Other regions (not shown) may be included in cantilevered arm 701.

Recessed region 706 includes tapers 707, bottom edge (or cover) 708, and recesses 709. Tapers 707 and recesses 709 are analogous to tapers 607 and recesses 609, respectively. If cantilevered arm 701 is utilized in a cooling system, such as cooling system(s) 100 and/or 400, bottom edge 708 adjoins a bottom chamber. Thus, if cantilevered arm 701 is utilized in a cooling system, such as cooling system(s) 100 and/or 400, recesses 709 provide cavities that can be viewed as increasing the size of the top chamber. Tapers 708 have a width that decreases with increasing distance from step region 704. For example, the taper (i.e. the change of the widths) might be selected from a linear taper, a quadratic taper, and a cubic taper. Other tapers are possible. In some embodiments, tapers 707 and recesses 709 may have constant width (i.e. be untapered).

In operation, cantilevered arm 701 functions in an analogous manner to cantilevered arm 601 of cooling element 600. Thus, cantilevered arm 701 can be driven to undergo vibrational motion. When used in a cooling system, such as cooling system(s) 100 and/or 400, cantilevered arm 701 may drive fluid at the velocities described herein. Thus, cantilevered arm 701 may be utilized to efficiently cool heat-generating structures. Moreover, recesses 709 may reduce the suction/pressure increase during the downstroke/upstroke of cantilevered arm 701. Thus, efficiency may be improved. Further, tapers 707 may reduce the stress to which cantilevered arm 701 is subjected during vibrational motion. Consequently, reliability of cantilevered arm 701 may be improved.

Figure 8:
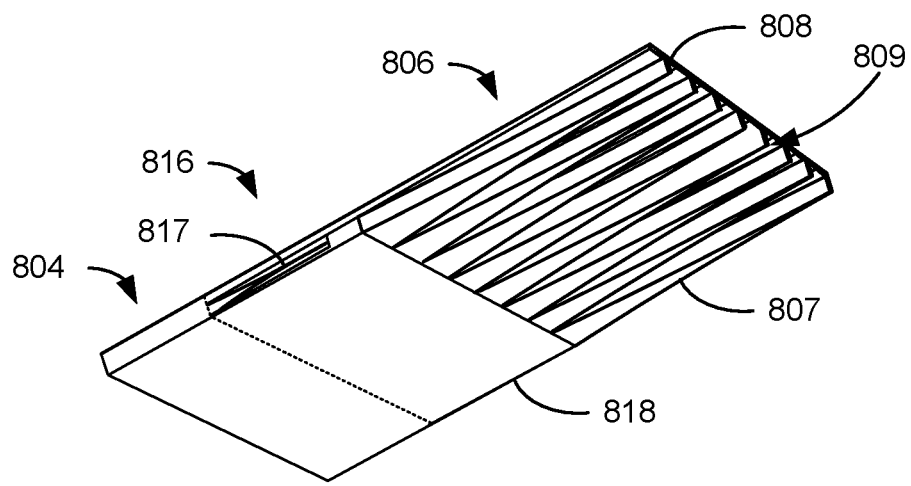

FIG. 8 is a perspective view of an embodiment of cantilevered arm 801 that may be part of a cooling element, such as cooling element 600. FIG. 8 is not to scale. Cantilevered arm 801 may be adjacent to an anchored region (not shown) that is may be used to support or hold the cooling element of which cantilevered arm 801 is a part. Cantilevered arm 801 may be part of a centrally anchored cooling element or part of an edge anchored cooling element in some embodiments. Cantilevered arm 801 undergoes vibrational motion in response to such a cooling element being driven. Cantilevered arm 801 includes step region 804 and recessed region 806. Step region 804 extends outward from an anchored region (not shown). Cantilevered arm 801 also includes additional recessed region 816. Recessed region 806 extends outward from additional recessed region 816. Other regions (not shown) may be included in cantilevered arm 800.

Recessed region 806 includes tapers 807, top edge 808, and recesses 809 that are analogous to recessed region 606, tapers 607, top edge 608 and recesses 609 of cooling element 600. Additional recessed region 816 includes tapers 817, bottom edge (or cover) 818, top edge 808, and recesses (not labeled in FIG. 8). Tapers 817 and recesses are analogous to tapers 807 and recesses 809, respectively. However, tapers 817 and the corresponding recesses are enclosed by bottom edge 818 and top edge 808. In some embodiments, the sides of recessed region 816 may also be enclosed. If cantilevered arm 801 is utilized in a cooling system, such as cooling system(s) 100 and/or 400, top edge 808 adjoins a top chamber and bottom edge 818 adjoins a bottom cavity. Thus, if cantilevered arm 801 is utilized in a cooling system, such as cooling system(s) 100 and/or 400, recesses 809 provide cavities that can be viewed as increasing the size of the bottom chamber. Thus, suction in the bottom chamber during an upstroke of cantilevered arm 801 and the increase in pressure during the downstroke of cantilevered arm 801 may be mitigated. Consequently, cantilevered arm 801 may more efficiently move through the fluid in the chambers. However, additional recessed section 816 does not significantly affect pressure in the surrounding chambers because of the presence of top edge 808 and bottom edge 818. Instead, additional recessed section 816 reduces stress.

In operation, cantilevered arm 801 functions in an analogous manner to cantilevered arm 601 of cooling element 600. Thus, cantilevered arm 801 can be driven to undergo vibrational motion. When used in a cooling system, such as cooling system(s) 100 and/or 400, cantilevered arm 801 may drive fluid at the velocities described herein. Thus, cantilevered arm 801 may be utilized to efficiently cool heat-generating structures. Moreover, recesses 809 may reduce the suction/pressure increase during the upstroke/downstroke of cantilevered arm 801. Thus, efficiency may be improved. Further, both tapers 808 and tapers 817 may reduce the stress to which cantilevered arm 801 is subjected during vibrational motion. Consequently, reliability of cantilevered arm 801 may be improved.

Figure 9:
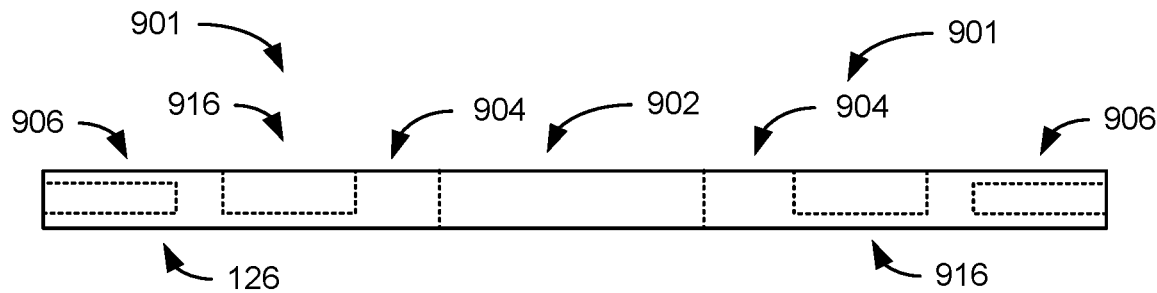

FIG. 9 depicts a side view of embodiments of actuator, or cooling element, 900. FIG. 9 is not to scale. Cooling element 900 is analogous to cooling element 600 and is usable in a cooling system, such as cooling system(s) 100 and/or 400. Thus, cooling element 900 includes anchored region 902 and cantilevered arms 901 that are analogous to anchored region 602 and cantilevered arms 601. Anchored region 602 is held in place in a cooling system, such as cooling system(s) 100 and/or 400, by an anchor such as anchor 160 and/or 460. Cantilevered arms 901 undergo vibrational motion in response to cooling element 900 being driven. In the embodiment shown, anchored region 902 is centrally located. In other embodiments, anchored region 902 may be at one edge of the actuator and recessed region 906 at the opposing edge. In such embodiments, the actuator is edge anchored.

Each cantilevered arm 901 is analogous to cantilevered arms 601, 701 and 801. Thus, each cantilevered arm includes step region 904, recessed region 906 and additional region 916. Recessed regions 906 and 916 include tapers (not explicitly shown) and recesses (not explicitly shown) that are analogous to tapers 607 and recesses 609. In the embodiment shown, recessed region 906 has top and bottom covers. Thus, recessed region 906 may reduce vibration induced stress in this portion of cantilevered arm 901 substantially without altering the pressure in the surrounding chambers. Additional recessed region 916 may both reduce stress and affect the pressure in the top chamber in which cooling element 900 is mounted.

Cooling element 900 functions in an analogous manner to cooling element 600. Thus, cantilevered arms 901 can be driven to undergo vibrational motion. When used in a cooling system, such as cooling system(s) 100 and/or 400, cooling element 900 may drive fluid at the velocities described herein. Thus, cooling element may be utilized to efficiently cool heat-generating structures. Moreover, recessed regions 906 and 916 may reduce the suction/pressure increase during the downstroke/upstroke of cantilevered arm 901. Thus, efficiency may be improved. Further, both recessed regions 90 and 91 may reduce the stress to which cantilevered arms 901 are subjected during vibrational motion. Consequently, reliability of cooling element 900 may be improved.

Figure 10:
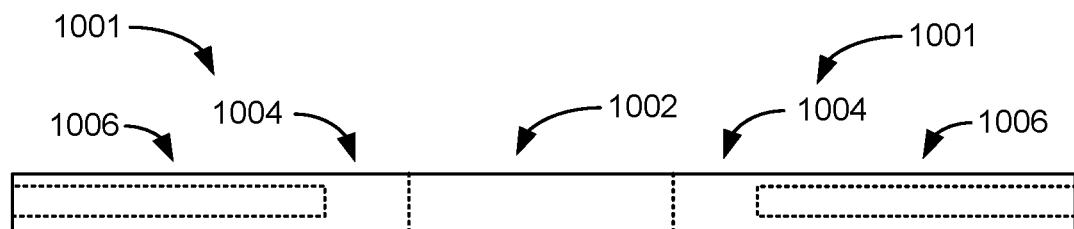

FIG. 10 depicts a side view of embodiments of actuator, or cooling element, 1000. FIG. 10 is not to scale. Cooling element 1000 is analogous to cooling element 600 and is usable in a cooling system, such as cooling system(s) 100 and/or 400. Thus, cooling element 1000 includes anchored region 1002 and cantilevered arms 1001 that are analogous to anchored region 602 and cantilevered arms 601. Anchored region 1002 is held in place in a cooling system, such as cooling system(s) 100 and/or 400, by an anchor such as anchor 160 and/or 460. Cantilevered arms 1001 undergo vibrational motion in response to cooling element 1000 being driven. In the embodiment shown, anchored region 1002 is centrally located. In other embodiments, anchored region 1002 may be at one edge of the actuator and recessed region 1006 at the opposing edge. In such embodiments, the actuator is edge anchored.

Each cantilevered arm 1001 is analogous to cantilevered arms 601, 701 and 801. Thus, each cantilevered arm includes step region 1004 and recessed region 1006. Recessed region 1006 includes tapers (not explicitly shown) and recesses (not explicitly shown) that are analogous to tapers 607 and recesses 609. In the embodiment shown, recessed region 1006 has top and bottom covers. Thus, recessed region 1006 may reduce vibration induced stress in this portion of cantilevered arm 1001 substantially without altering the pressure in the surrounding chambers.

Cooling element 1000 functions in an analogous manner to cooling element 600. Thus, cantilevered arms 1001 can be driven to undergo vibrational motion. When used in a cooling system, such as cooling system(s) 100 and/or 400, cooling element 1000 may drive fluid at the velocities described herein. Thus, cooling element 1000 may be utilized to efficiently cool heat-generating structures. Moreover, recessed region 1006 may reduce the stress to which cantilevered arms 1001 are subjected during vibrational motion. Consequently, reliability of cooling element 1000 may be improved.

Figure 11:
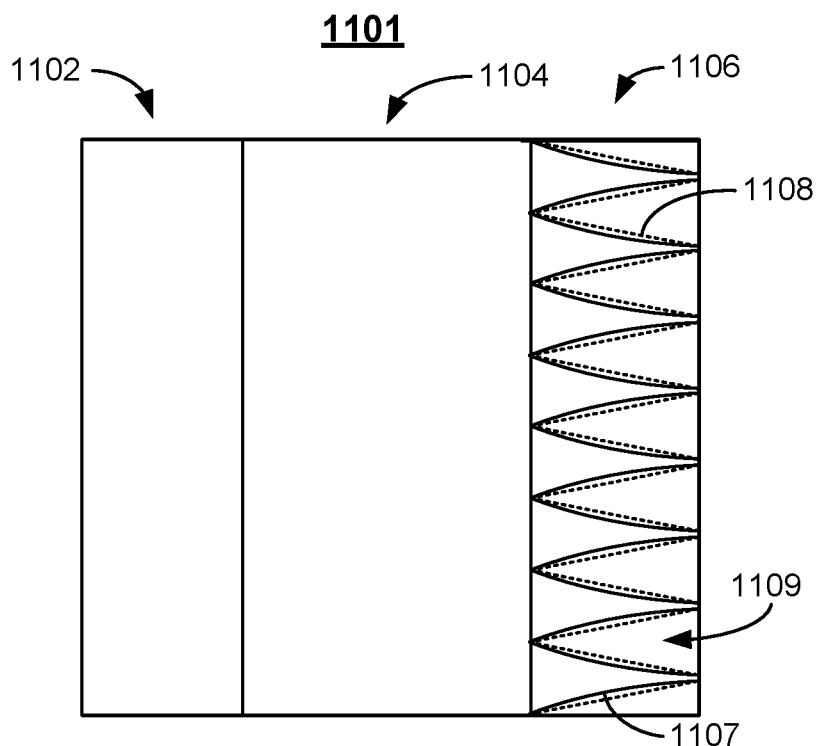
Figure 12:
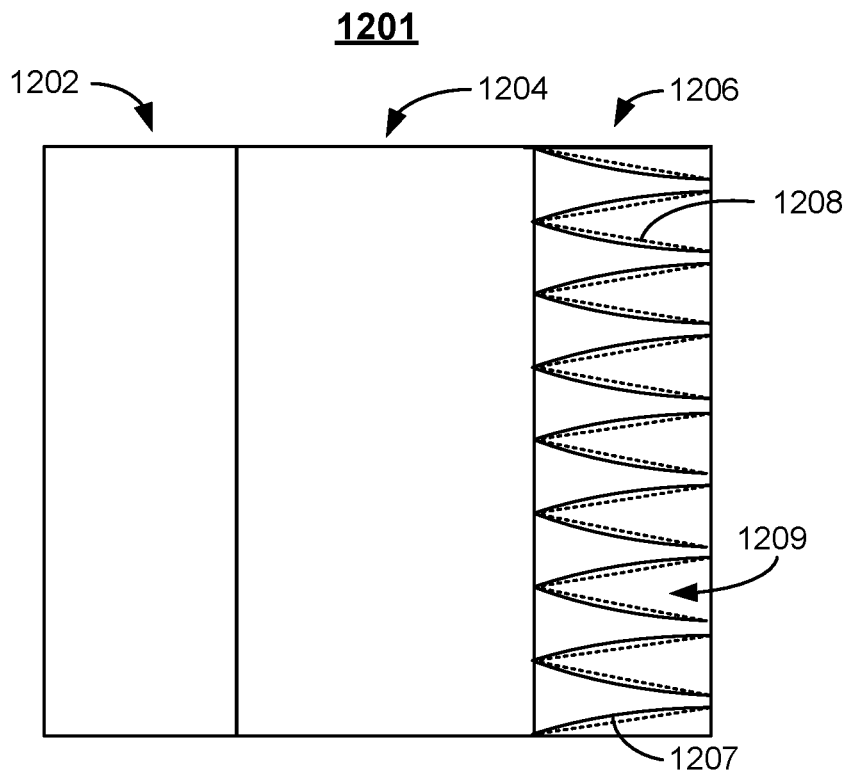
Figure 13:
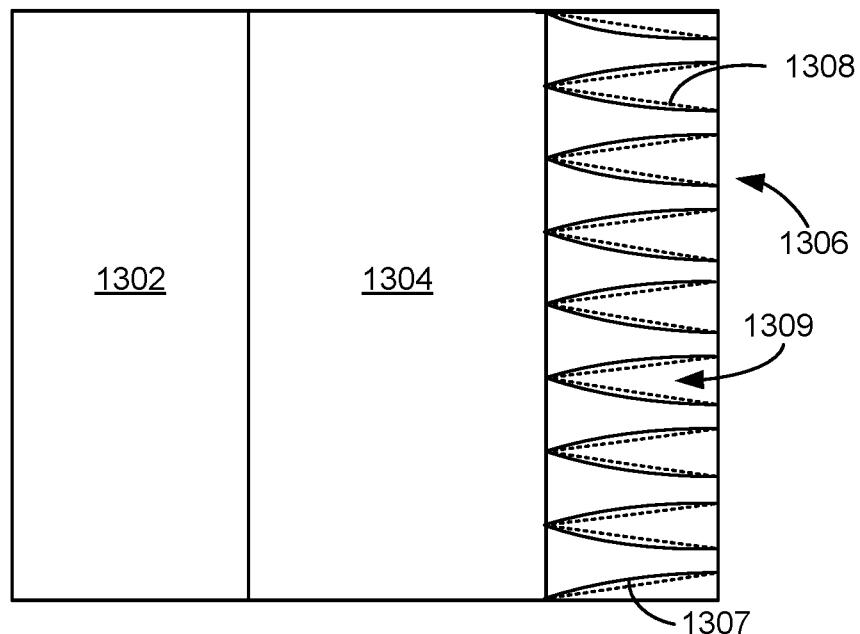

FIGS. 11-13 depict embodiments of cantilevered arms 1101, 1201 and 1301 that may be part of a cooling element, such as cooling element 600. FIGS. 11-13 are not to scale. Cantilevered arm 1101, 1201 and/or 1301 may be adjacent to an anchored region (not shown) that is may be used to support or hold the cooling element of which cantilevered arm 1101, 1201 and/or 1301 is a part. Cantilevered arm 1101, 1201 and/or 1301 may be part of a centrally anchored cooling element or part of an edge anchored cooling element in some embodiments. Cantilevered arm 1101, 1201 and 1301 each undergoes vibrational motion in response to such a cooling element being driven. Cantilevered arm 1101 includes step region 1104 and recessed region 1106. Also shown is anchored region 1102. Step region 1104 extends outward from an anchored region 1102. Recessed region 1106 extends outward from step region 1104. Cantilevered arm 1201 includes step region 1204 and recessed region 1206. Also shown is anchored region 1202. Step region 1204 extends outward from an anchored region 1202. Recessed region 1206 extends outward from step region 1204. Cantilevered arm 1301 includes step region 1304 and recessed region 1306. Also shown is anchored region 1302. Step region 1304 extends outward from an anchored region 1302. Recessed region 1306 extends outward from step region 1304. Other regions (not shown) may be included in cantilevered arms 1101, 1201 and/or 1301.

Recessed regions 1106, 1206 and 1306 each includes tapers 1107, 1207 and 1307, respectively, as well as recesses 1109, 1209 and 1309, respectively. Cantilevered arms 1101, 1201 and 1301 indicate that variations in tapers 1107, 1207 and 1307 can also be used to tailor the stiffness of cantilevered arm 1101, 1201 and 1301, respectively. For example, tapers 1107, 1207 and 1307 may decrease in width as the square of the distance from the transition between step region 1104, 1204 and 1304, respectively, and recessed region 1106, 1206 and 1306, respectively. Dashed lines 1108, 1208 and 1308 indicate how the widths of tapers 1107, 1207 and 1037, respectively, might decrease if the widths varied linearly with distance from the transition between step region 1104, 1204 and 1304, respectively, and recessed region 1106, 1206 and 1306, respectively. In addition, tapers 1107, 1207 and 1307 decrease in width by different fractions. Tapers 1107 decrease in width the most at the edge (e.g. by approximately ninety percent percent). Tapers 1207 decrease by a smaller fraction at the opposing edge (e.g. by approximately seventy-five percent). Tapes 1307 decrease by the smallest fraction at the opposing edge (e.g. by approximately fifty percent). Other variations in width (e.g. cubic) and other tapering amounts may be used. By tailoring the way in which tapers change width and/or the amount by which the width changes, the stiffness of the cantilevered arm and the reduction in stress may be modified.

Cantilevered arms 1101, 1201 and 1301 functions in an analogous manner to cantilevered arms 601 of cooling element 600. Thus, cantilevered arms 1101, 1201 and 1301 can be driven to undergo vibrational motion. When used in a cooling system, such as cooling system(s) 100 and/or 400, cantilevered arms 1101, 1201 and 1301 may drive fluid at the velocities described herein. Thus, cantilevered arms 1101, 1201 and 1301 may be utilized to efficiently cool heat-generating structures. Moreover, recessed regions can be configured to reduce stress while maintaining stiffness. Consequently, reliability of cantilevered arms 1101, 1201 and 1301 may be improved.

Figure 14A:
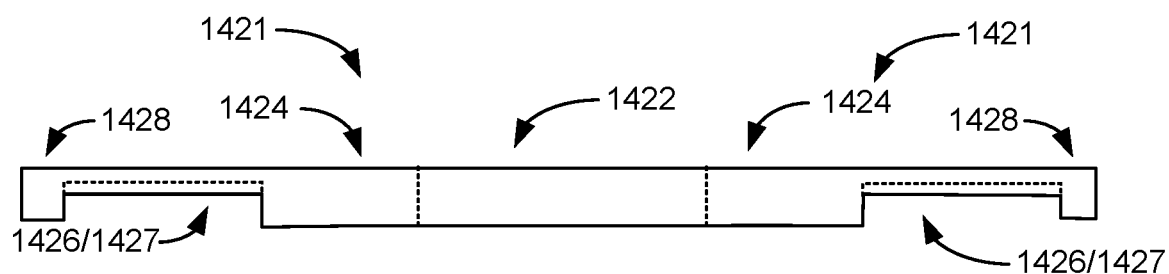
FIGS. 14A-14B depict embodiments of an engineered actuator.
Figure 14B:
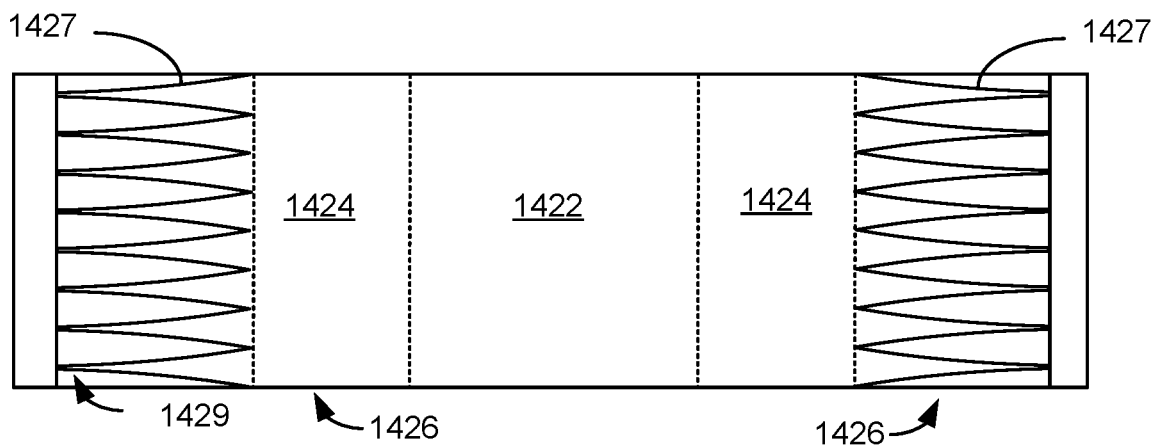

FIGS. 14A and 14B depict side and bottom views of embodiments of actuator, or cooling element, 1400. FIGS. 14A-14B are not to scale. Cooling element 1400 is analogous to cooling element 120 and cooling element 600. Cooling element 1400 is usable in a cooling system, such as cooling system(s) 100 and/or 400. Thus, cooling element 1400 includes anchored region 1422 and cantilevered arms 1421 that are analogous to anchored regions 122 and 602 and to cantilevered arms 121 and 601. Anchored region 1422 is held in place in a cooling system, such as cooling system(s) 100 and/or 400, by an anchor such as anchor 160 and/or 460. Cantilevered arms 1421 undergo vibrational motion in response to cooling element 1400 being driven. In the embodiment shown, anchored region 1422 is centrally located. In other embodiments, anchored region 1422 may be at one edge of the actuator.

Each cantilevered arm 1421 is analogous to cantilevered arms 121 as well as to cantilevered arms 601, 701 and 801. Thus, each cantilevered arm includes step region 1424, extension region 1426 and outer region 1428 that are analogous to step region 124, extension region 126 and outer region 128. Cantilevered arms 1421 each include recessed region 1406 having tapers 1427 and recesses 1429 analogous to tapers 627 and recesses 629. Thus, portions of extension region 1426 are also recessed. In some embodiments, step region 1424 and/or outer region 1428 may include recesses and/or tapers instead of or in addition to extension region 1426. Thus, the configuration of cooling element 120 and the recesses of cooling element(s) 600, 900, and/or 1000 and/or cantilevered arms 701, 801, 1101, 1201 and/or 1301 may be combined in various manners.

Cooling element 1400 functions in an analogous manner to cooling elements 120 and 600. Thus, cantilevered arms 1401 can be driven to undergo vibrational motion. When used in a cooling system, such as cooling system(s) 100 and/or 400, cooling element 1400 may drive fluid at the velocities described herein. Thus, cooling element 1400 may be utilized to efficiently cool heat-generating structures. Moreover, the ability of cantilevered arm 1401 to move through the fluid may be improved and the stress to which cantilevered arms 1401 are subjected during vibrational motion reduced. Consequently, efficiency, performance and reliability of cooling element 1400 may be improved.

Various cooling elements 120, 420, 600, 900, 1000 and 1400 and various cantilevered arms 701, 801, 1101, 1201 and 1301 have been described and particular features highlighted. Various characteristics of cooling elements 120, 420, 600, 900, 1000 and 1400 and various cantilevered arms 701, 801, 1101, 1201 and 1301 can be combined in manners not explicitly depicted herein.

Figure 15A:
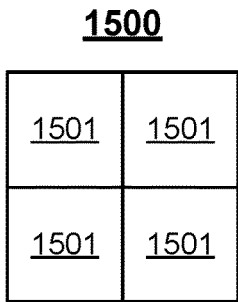
FIGS. 15A-15B depict an embodiment of an active cooling system including multiple cooling cells configured as a tile and using engineered actuators.
Figure 15B:
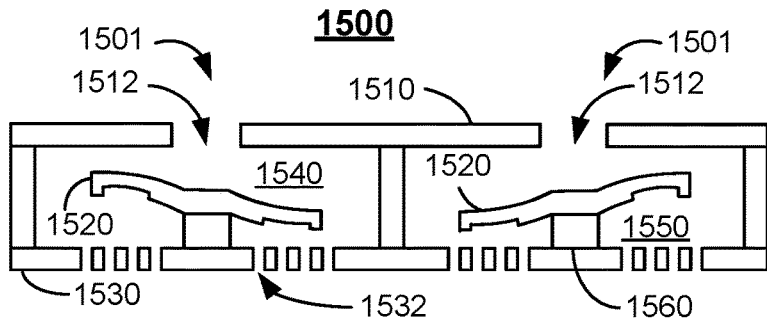

FIGS. 15A-15B depict an embodiment of active cooling system 1500 including multiple cooling cells configured as a tile. FIG. 15A depicts a top view, while FIG. 15B depicts a side view. FIGS. 15A-15B are not to scale. Cooling system 1500 includes four cooling cells 1501, which are analogous to one or more of cooling systems described herein, such as cooling systems 100 and/or 400. Although four cooling cells 1501 in a 2×2 configuration are shown, in some embodiments another number and/or another configuration of cooling cells 1501 might be employed. In the embodiment shown, cooling cells 1501 include shared top plate 1510 having apertures 1512, cooling elements 1520, shared orifice plate 1530 including orifices 1532, top chambers 1540, bottom chambers 1550 and anchors (support structures) 1560 that are analogous to top plate 110 having apertures 112, cooling element 120, orifice plate 130 having orifices 132, top chamber 140, bottom chamber 150 and anchor 160. Although depicted in the context of cooling element 920, any combination of cooling elements 120, 420, 600, 900, 1000 and 1400 and various cantilevered arms 701, 801, 1101, 1201 and 1301 may be used. Although bottom anchors 1560 are shown, in other embodiments top anchors may be used. In the embodiment shown, cooling elements 1520 are driven out-of-phase (i.e. in a manner analogous to a seesaw). Further, cooling element 1520 in one cell is driven out-of-phase with cooling element(s) in adjacent cell(s).

Cooling cells 1501 of cooling system 1500 function in an analogous manner to cooling system(s) 100 and/or 400. Consequently, the benefits described herein may be shared by cooling system 1500. Because cooling elements in nearby cells are driven out-of-phase, vibrations in cooling system 1500 may be reduced. Because multiple cooling cells 1501 are used, cooling system 1500 may enjoy enhanced cooling capabilities.

Figure 16:
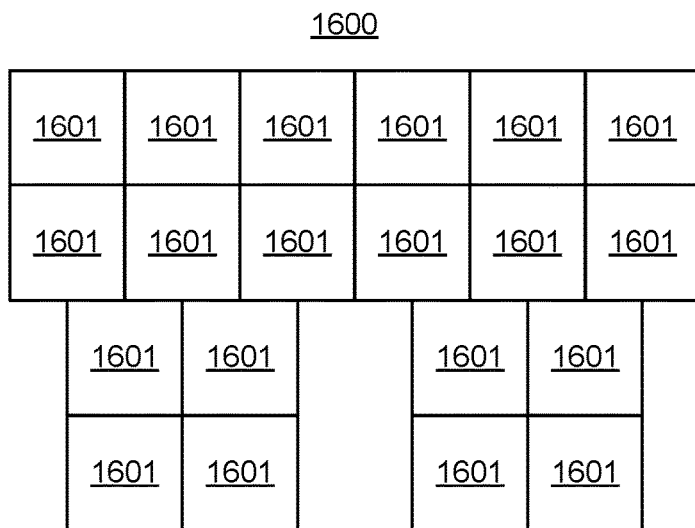
FIG. 16 depicts an embodiment of an active cooling system including multiple cooling cells.

FIG. 16 depicts a top view of an embodiment of cooling system 1600 including multiple cooling cells 1601. FIG. 16 is not to scale. Cooling cells 1601 are analogous one or more of the cooling systems described herein, such as cooling systems 100 and/or 400. As indicated in cooling system 1600, cooling cells 1601 may be arranged in a two-dimensional array of the desired size and configuration. In some embodiments, cooling system 1600 may be viewed as made up of multiple tiles 160. Thus, the desired cooling power and configuration may be achieved.

Figure 17:
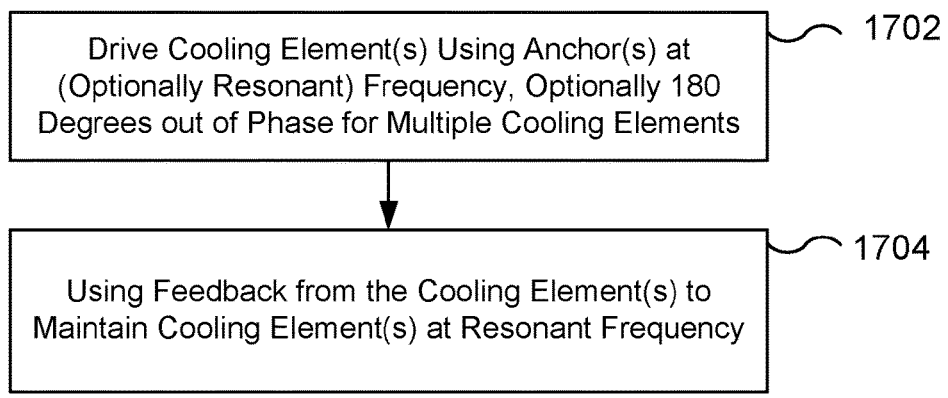
FIG. 17 is a flow chart depicting an embodiment of a technique for driving an actuator.

FIG. 17 is a flow chart depicting an exemplary embodiment of method 1700 for operating a cooling system. Method 1700 may include steps that are not depicted for simplicity. Method 1700 is described in the context of piezoelectric cooling system 100. However, method 1700 may be used with other cooling systems including but not limited to systems and cells described herein.

One or more of the cooling element(s) in a cooling system is actuated to vibrate, at 1702. At 1702, an electrical signal having the desired frequency is used to drive the cooling element(s). In some embodiments, the cooling elements are driven at or near structural and/or acoustic resonant frequencies at 1702. The driving frequency may be 15 kHz or higher. If multiple cooling elements are driven at 1702, the cooling elements may be driven out-of-phase. In some embodiments, the cooling elements are driven substantially at one hundred and eighty degrees out of phase. Further, in some embodiments, individual cooling elements are driven out-of-phase. For example, different portions of a cooling element may be driven to vibrate in opposite directions (i.e. analogous to a seesaw). In some embodiments, individual cooling elements may be driven in-phase (i.e. analogous to a butterfly). In addition, the drive signal may be provided to the anchor(s), the cooling element(s), or both the anchor(s) and the cooling element(s). Further, the anchor may be driven to bend and/or translate.

Feedback from the piezoelectric cooling element(s) is used to adjust the driving current, at 1704. In some embodiments, the adjustment is used to maintain the frequency at or near the acoustic and/or structural resonant frequency/frequencies of the cooling element(s) and/or cooling system. Resonant frequency of a particular cooling element may drift, for example due to changes in temperature. Adjustments made at 1704 allow the drift in resonant frequency to be accounted for.

For example, piezoelectric cooling element 120 may be driven at its structural resonant frequency/frequencies, at 1702. This resonant frequency may also be at or near the acoustic resonant frequency for top chamber 140. This may be achieved by driving piezoelectric layer(s) in anchor 160 (not shown in FIGS. 1A-1F) and/or piezoelectric layer(s) in cooling element 120. At 1704, feedback is used to maintain cooling element 120 at resonance and, in some embodiments in which multiple cooling elements are driven, one hundred and eighty degrees out of phase. Thus, the efficiency of cooling element 120 in driving fluid flow through cooling system 100 and onto heat-generating structure 102 may be maintained. In some embodiments, 1704 includes sampling the current through cooling element 120 and/or the current through anchor 160 and adjusting the current to maintain resonance and low input power.

Consequently, cooling elements, such as cooling element(s) 120, 420, 600, 900, 1000 and 1400 and various cantilevered arms 701, 801, 1101, 1201 and 1301 may operate as described above. Method 1700 thus provides for use of piezoelectric cooling systems described herein. Thus, piezoelectric cooling systems may more efficiently and quietly cool semiconductor devices at lower power.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An actuator, comprising:
  an anchored region; and
  a cantilevered arm extending outward from the anchored region wherein the cantilevered arm includes
    a step region extending outward from the anchored region having a step thickness;
    an extension region extending outward from the step region having an extension thickness less than the step thickness; and
    an outer region extending outward from the extension region having an outer thickness greater than the extension thickness;

wherein the actuator resides in a system including a chamber, an orifice plate including at least one orifice therein, and a support structure, the actuator residing in the chamber and being supported by the support structure at the anchored region, a portion of the extension region being aligned with at least a portion of the at least one orifice, the actuator separating the chamber into a top chamber and a bottom chamber in fluid communication with the top chamber, the orifice plate forming a wall of the bottom chamber, the actuator being configured to undergo vibrational motion of the cantilevered arm when actuated to draw a fluid into the top chamber, direct the fluid through the top chamber and into the bottom chamber, and drive the fluid out of the bottom chamber through the at least one orifice.

2. The actuator of claim 1, wherein the extension region further includes:
an additional step region between the step region and the outer region, the additional step region having an additional step thickness less than the step thickness and greater than the extension thickness.

3. The actuator of claim 1, wherein the outer thickness is at least fifty micrometers and not more than two hundred micrometers thicker than the extension thickness, wherein the outer region has a width of at least one hundred micrometers and not more than three hundred micrometers, and wherein the extension region has a length extending outward from the step region of at least 0.5 millimeter and not more than 1.5 millimeters.

4. The actuator of claim 1, wherein at least one of the step region, the extension region and the outer region includes at least one recess therein.

5. The actuator of claim 4, wherein the at least one recess includes a taper such that a width of the at least one recess increases with distance from the anchored region.

6. The actuator of claim 5, wherein the taper is selected from a linear taper, a quadratic taper, and a cubic taper.

7. The actuator of claim 4, further comprising:
a cover configured such that the at least one recess is internal to the actuator.

8. The actuator of claim 1, further comprising:
an additional cantilevered arm extending outward from the anchored region opposite to the cantilevered arm, and wherein the additional cantilevered arm includes
an other step region extending outward from the anchored region having an other step thickness;
an additional extension region extending outward from the other step region and having an additional extension thickness less than the other step thickness; and
an additional outer region extending outward from the additional extension region and having an additional outer thickness greater than the additional extension thickness.

9. The actuator of claim 1, wherein the at least one orifice includes a plurality of orifices and wherein the portion of the extension region is aligned with all of the plurality of orifices.

10. The actuator of claim 1 wherein the vibrational motion of the cantilevered arm is configured to drive the fluid out of the bottom chamber at a speed of at least thirty meters per second.

11. The actuator of claim 1 wherein the system has a thickness of not more than two millimeters.

12. A cooling system, comprising:
a chamber;
an orifice plate including at least one orifice therein;
an anchor in the chamber; and
a cooling element including an anchored region and a cantilevered arm, the anchored region being fixed by the anchor, the cantilevered arm extending outward from the anchored region wherein the cantilevered arm includes
a step region extending outward from the anchored region having a step thickness;
an extension region extending outward from the step region having an extension thickness less than the step thickness, a portion of the extension region being aligned with at least a portion of the at least one orifice; and
an outer region extending outward from the extension region having an outer thickness greater than the extension thickness;
wherein the cooling element resides in the chamber and separates the chamber into a top chamber and a bottom chamber in fluid communication with the top chamber, the orifice plate forming a wall of the bottom chamber, the cooling element being configured to undergo vibrational motion of the cantilevered arm when actuated to draw a fluid into the top chamber, direct the fluid through the top chamber and into the bottom chamber, and drive the fluid out of the bottom chamber through the at least one orifice.

13. The cooling system of claim 12, wherein the extension region further includes:
an additional step region between the step region and the outer region, the additional step region having an additional step thickness less than the step thickness and greater than the extension thickness.

14. The cooling system of claim 12, wherein at least one of the step region, the extension region and the outer region includes at least one recess therein.

15. The cooling system of claim 14, wherein the cooling element further includes:
a cover configured such that the at least one recess is internal to the cooling element.

16. The cooling system of claim 12, wherein the cooling element further includes:
an additional cantilevered arm extending outward from the anchored region opposite to the cantilevered arm, and wherein the additional cantilevered arm includes
an other additional step region extending outward from the anchored region and having an other step thickness;
an additional extension region extending outward from the other step region and having an additional extension thickness less than the other step thickness; and
an additional outer region extending outward from the additional extension region and having an additional outer thickness greater than the additional extension thickness.

17. The cooling system of claim 16,
wherein the orifice plate is disposed between the cooling element and a heat-generating structure; and
wherein the vibrational motion of the cantilevered arm drives fluid through the at least one orifice toward the heat-generating structure.

18. The cooling system of claim 17, further comprising:
a plurality of cell walls, configured such that the top chamber is formed between a portion of the plurality of cell walls and the cooling element and the bottom chamber is formed between the plurality of cell walls, the orifice plate, and the cooling element.

19. A method of cooling a heat-generating structure, comprising:

driving a cooling element to induce a vibrational motion at a frequency, the cooling element including an anchored region and a cantilevered arm, the cantilevered arm extending outward from the anchored region;

wherein the cantilevered arm includes a step region, an extension region and an outer region, the step region extending outward from the anchored region having a step thickness, the extension region extending outward from the step region having an extension thickness less than the step thickness, the outer region extending outward from the extension region having an outer thickness greater than the extension thickness, the cooling element residing in a system including a chamber, an orifice plate including at least one orifice therein, and a support structure, the cooling element residing in the chamber and being supported by the support structure at the anchored region, a portion of the extension region being aligned with at least a portion of the at least one orifice, the cooling element dividing the chamber into a top chamber and a bottom chamber in fluid communication with the top chamber, the orifice plate forming a wall of the bottom chamber, the cooling element being configured to undergo vibrational motion of the cantilevered arm when actuated to drive to draw a fluid into the top chamber, direct the fluid through the top chamber and into the bottom chamber, and drive the fluid out of the bottom chamber through the at least one orifice.

20. The method of claim 19 wherein the driving further includes:

driving the cooling element substantially at a structural resonant frequency for the cantilevered arm.

21. The method of claim 20, the driving further includes:

driving the cooling element substantially at a fluidic resonant frequency.

22. The method of claim 19, wherein the cooling element further includes an additional cantilevered arm extending outward from the anchored region opposite to the cantilevered arm, the additional cantilevered arm including an other step region, an additional extension region, and an additional outer region, the other step region extending outward from the anchored region and having an other step thickness, the additional extension region extending outward from the other step region and having an additional extension thickness less than the other step thickness, the additional outer region extending outward from the additional extension region and having an additional outer thickness greater than the additional extension thickness, the method further comprising:

driving the additional cantilevered arm at the frequency.

23. The method of claim 22 wherein the driving frequency is substantially at least one of an additional structural resonant frequency for the additional cantilevered arm and a fluidic resonant frequency.

* * * * *

UNITED STATES PATENT AND TRADEMARK OFFICE
CERTIFICATE OF CORRECTION

PATENT NO. : 11,510,341 B2
APPLICATION NO. : 17/023215
DATED : November 22, 2022
INVENTOR(S) : Vikram Mukundan et al.

It is certified that error appears in the above-identified patent and that said Letters Patent is hereby corrected as shown below:

In the Claims

In Column 27, Line(s) 58, Claim 10, after "claim 1", insert --,--.
In Column 27, Line(s) 62, Claim 11, after "claim 1", insert --,--.
In Column 30, Line(s) 3, Claim 20, after "claim 19", insert --,--.
In Column 30, Line(s) 25, Claim 23, after "claim 22", insert --,--.

Signed and Sealed this
Fifth Day of September, 2023

Katherine Kelly Vidal
*Director of the United States Patent and Trademark Office*